United States Patent
Adkisson et al.

(10) Patent No.: US 9,058,455 B2
(45) Date of Patent: Jun. 16, 2015

(54) BACKSIDE INTEGRATION OF RF FILTERS FOR RF FRONT END MODULES AND DESIGN STRUCTURE

(75) Inventors: James W. Adkisson, Jericho, VT (US);
Panglijen Candra, Williston City, VT (US); Thomas J. Dunbar, Burlington, VT (US); Jeffrey P. Gambino, Westford, VT (US); Mark D. Jaffe, Shelburne, VT (US); Anthony K. Stamper, Williston, VT (US); Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 496 days.

(21) Appl. No.: 13/354,705

(22) Filed: Jan. 20, 2012

(65) Prior Publication Data
US 2013/0187246 A1  Jul. 25, 2013

(51) Int. Cl.
| G06F 17/50 | (2006.01) |
| H01L 21/768 | (2006.01) |
| H01L 23/48 | (2006.01) |
| H03H 9/64 | (2006.01) |
| H01L 23/00 | (2006.01) |
| H01L 27/06 | (2006.01) |
| H01L 49/02 | (2006.01) |
| H01L 23/66 | (2006.01) |
| H01L 25/16 | (2006.01) |

(52) U.S. Cl.
CPC ... *G06F 17/5068* (2013.01); H01L 2225/06548 (2013.01); *H01L 21/76898* (2013.01); *H01L 23/481* (2013.01); H01L 27/0694 (2013.01); H01L 28/40 (2013.01); *H03H 9/64* (2013.01); *H01L 24/24* (2013.01); H01L 23/66 (2013.01); H01L 25/16 (2013.01)

(58) Field of Classification Search
CPC .............................................. H01L 2225/06548
USPC .......................................................... 257/794
See application file for complete search history.

(56) References Cited

U.S. PATENT DOCUMENTS

| 5,241,209 A | 8/1993 | Sasaki |
| 6,285,559 B1 * | 9/2001 | Fukiharu ........................ 361/760 |
| 6,380,618 B1 | 4/2002 | Wang et al. |
| 6,766,149 B1 * | 7/2004 | Hikita et al. ..................... 455/83 |
| 7,213,314 B2 | 5/2007 | Abbott et al. |

(Continued)

FOREIGN PATENT DOCUMENTS

| JP | 58002059 | 1/1983 |
| JP | 2006-128669 A * | 5/2006 |

OTHER PUBLICATIONS

Trzcinski, T. et al., "Surface Acoustic Wave (SAW) filter technology", Telecommunication Electronics Mini-project, Torino, Oct. 29, 2008, pp. 1-8.

(Continued)

*Primary Examiner* — Daniel Luke
(74) *Attorney, Agent, or Firm* — Anthony Canale; Roberts Mlotkowski Safran & Cole, P.C.

(57) ABSTRACT

A design structure for an integrated radio frequency (RF) filter on a backside of a semiconductor substrate includes: a device on a first side of a substrate; a radio frequency (RF) filter on a backside of the substrate; and at least one substrate conductor extending from the front side of the substrate to the backside of the substrate and electrically coupling the RF filter to the device.

18 Claims, 16 Drawing Sheets

(56) References Cited

U.S. PATENT DOCUMENTS

| 7,518,201 | B2 | 4/2009 | Stelzl et al. |
| 7,691,747 | B2 | 4/2010 | Lin et al. |
| 7,795,728 | B2* | 9/2010 | Przadka ................ 257/724 |
| 2002/0023765 | A1* | 2/2002 | Sugiura et al. ............ 174/52.2 |
| 2003/0210111 | A1 | 11/2003 | Shin |

OTHER PUBLICATIONS

Mahon, S. et al., "Bulk Acoustic Wave Devices—Why, How, and Where They are Going", CS MANTECH Conference, May 14-17, 2007, pp. 15-18.

Noriki, A. et al., "High-Aspect-Ratio Fine Cu Sidewall Interconnection over Chip Edge with Tapered Polymer for MEMS-LSI Multi-Chip Module", Extended Abstracts of the 2009 International Conference on Solid State Devices and Materials, 2009, pp. 88-89.

Ancey, P., "Above IC RF MEMS and BAW filters: fact or fiction?", IEEE, 2006, 5 pages.

Pornin, J. L et al., "Wafer Level Thin Film Encapsulation for BAW RF MEMS", Electronic Components and Technology Conference, 2007, pp. 605-609.

Volpert, M. et al., "A Fluxless Bonding Process using AuSn or Indium for a Miniaturized Hermetic Package", Electronic Components and Technology Conference, 2009, pp. 224-231.

Mahon, S. et al., "BAW Flip-Chip Switched Filter Bank Delivers Dramatic Form Factor Reduction", High Frequency Electronics, Summit Technical Media, LLC, Aug. 2008, 3 pages.

Kim, J. et al., "Fluxless Hermetic Lid Sealing Using Electroplated Sn-Rich Solder", IEEE Transactions on Components and Packaging Technologies, vol. 31, No. 3, Sep. 2008, pp. 719-725.

Author Unknown, "Film Bulk Acoustic-Wave Resonator (FBAR)", http://mems.usc.edu/fbar.htm, University of Southern California, downloaded Jan. 19, 2012, pp. 1-4.

\* cited by examiner

US 9,058,455 B2

BACKSIDE INTEGRATION OF RF FILTERS FOR RF FRONT END MODULES AND DESIGN STRUCTURE

FIELD OF THE INVENTION

The invention relates to semiconductor structures and methods of manufacture and, more particularly, to design structures for an integrated radio frequency (RF) filter on a backside of a semiconductor substrate upon which devices are formed on an opposite front side and associated structures and methods of manufacture.

BACKGROUND

Radio frequency (RF) filters are used in wireless communication systems. Two types of RF filters are Surface Acoustic Wave (SAW) filters and Bulk Acoustic Wave (BAW) filters. A SAW filter typically comprises a pair of interdigitated electrical conductive traces formed on a surface of a piezoelectric material. A BAW filter typically comprises a piezoelectric material sandwiched between two electrodes and acoustically isolated from the surrounding medium. SAW filters are generally used at relatively lower frequencies, e.g., below 2.5 GHz, whereas BAW filters are generally used at relatively higher frequencies, e.g., above 2.5 GHz. SAW and BAW devices may be formed and subsequently attached to a substrate or circuit board using, e.g., flip chip techniques.

Alternatively, SAW and BAW devices may be incorporated into an integrated circuit (IC) chip at the wafer level, e.g., during CMOS (complementary metal oxide semiconductor) processing. The latter approach, i.e., forming RF filters at the wafer level during CMOS processing, eliminates the need for additional chips. However, integrating RF filters, including SAW and BAW filters, at the wafer level during CMOS processing is difficult due at least in part to the fabrication scale on monolithic devices.

Accordingly, there exists a need in the art to overcome the deficiencies and limitations described hereinabove.

SUMMARY

In a first aspect of the invention, a method includes providing a radio frequency (RF) filter at a backside of a substrate. The method also includes forming at least one substrate conductor through the substrate, wherein the at least one substrate conductor electrically couples the RF filter to at least one device at a front side of the substrate.

In another aspect of the invention a method includes forming a device on a front side of a substrate. The method also includes forming an insulator layer at the front side of the substrate and covering the device. The method also includes forming a through-silicon-via (TSV) extending entirely through the substrate and the insulator layer. The method also includes forming a radio frequency (RF) filter on a backside of the substrate opposite the front side of the substrate. The method also includes forming an encapsulating seal around the RF filter at the backside of the substrate. The TSV electrically couples the RF filter to the device.

In yet another aspect of the invention, a semiconductor structure includes a device on a first side of a substrate. The structure also includes a radio frequency (RF) filter on a backside of the substrate. The structure also includes at least one substrate conductor extending from the front side of the substrate to the backside of the substrate and electrically coupling the RF filter to the device.

In another aspect of the invention, there is a method in a computer-aided design system for generating a functional design model of an RF filter. The method includes generating a functional representation of a device on a first side of a substrate. The method also includes generating a functional representation of a radio frequency (RF) filter on a backside of the substrate. The method also includes generating a functional representation of at least one substrate conductor extending from the front side of the substrate to the backside of the substrate and electrically coupling the RF filter to the device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to a design structure for an integrated radio frequency (RF) filter on a backside of a semiconductor substrate upon which devices are formed on an opposite front side and associated structures and methods of manufacture. According to aspects of the invention, an RF filter, such as a band-pass SAW or BAW filter, is formed on the backside of a semiconductor substrate. Other devices, such as transistors included in RF modules, are formed on a front side of the substrate opposite the backside. At least one conductor, such as a through-silicon-via (TSV), is arranged through the substrate to provide electrical communication between the RF filter on the backside and the other devices on the front side. In embodiments, the RF filter is integrated at the wafer level, e.g., is completely formed on the backside of the substrate using CMOS processing. In this manner, space savings may be achieved by utilizing the backside of the substrate.

Figure 1:
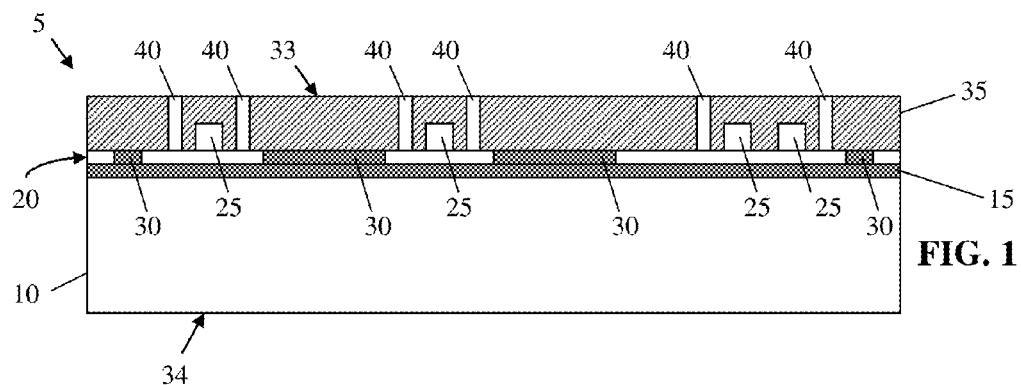
FIGS. 1-33 show processing steps and respective structures in accordance with additional aspects of the invention.

FIGS. 1-33 show processing steps and respective structures in accordance with additional aspects of the invention. In particular, FIG. 1 shows a cross section of a portion of a semiconductor structure 5 that has undergone CMOS processing. The semiconductor structure 5 may comprise a substrate 10. The substrate 10 may be composed of any suitable material or combination of materials, such as doped or undoped silicon, glass, etc. FIG. 1 further shows a semiconductor-on-insulator (SOI) configuration in which a buried insulator layer 15 is formed on the substrate 10, and a semiconductor layer 20 is formed on the buried insulator layer 15. The buried insulator layer 15 and semiconductor layer 20 may be composed of any suitable materials, such as oxide and silicon, respectively.

Devices 25 may be active devices such as field effect transistors (FETs) and may be formed on the semiconductor layer 20, and isolation regions 30 such as shallow trench isolation (STI) may be selectively arranged within the semiconductor layer 20, e.g., between the devices 25. Although an SOI configuration is shown, it is understood that the devices 25 may equally be arranged on a bulk material substrate, e.g., with appropriately doped regions typically referred to as wells. The substrate 10, buried insulator layer 15, semiconductor layer 20, devices 25, and isolation regions 30 may be formed using conventional semiconductor manufacturing processes and materials.

In embodiments, the devices 25 are formed on a first side of the substrate 10 referred to herein as the front side 33 of the substrate 10. The substrate 10 also includes a second side opposite the first side referred to herein as a backside 34. In embodiments, one or more of the devices 25 on the front side 33 are included in an RF module that is usable, for example, in wireless communications.

Still referring to FIG. 1, the semiconductor structure 5 may also comprise an insulator layer 35 formed over the devices 25 and semiconductor layer 20, and contacts 40 formed in the insulator layer 35. The insulator layer 35 may be composed of any suitable electrical insulator material, and the contacts 40 may be composed of any suitable electrically conductive material. The insulator layer 35 and the contacts 40 may be formed using conventional semiconductor manufacturing processes and materials. The contacts 40 are structured and arranged to provide electrical communication pathways to the devices 25, as is understood to those of ordinary skill in the art such that further explanation is not necessary.

Figure 2:
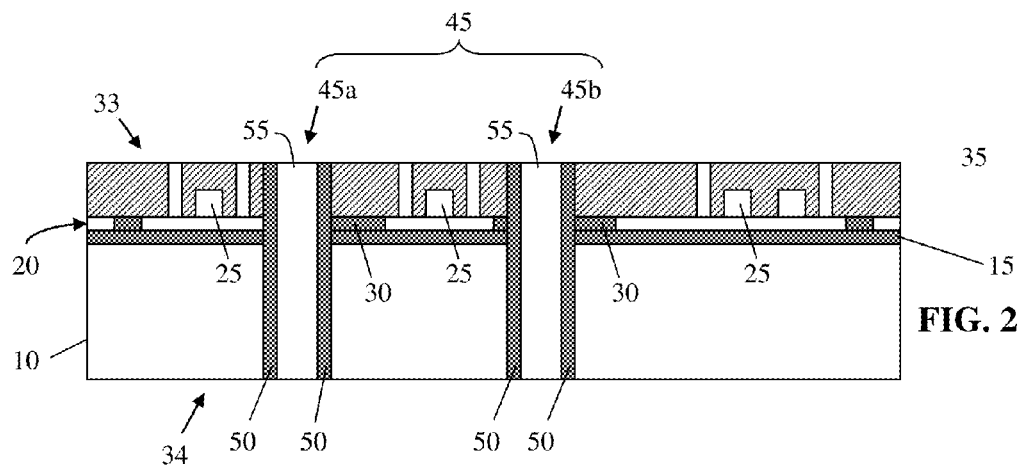

As depicted in FIG. 2, at least one substrate conductor 45 is formed through the substrate 10, e.g., extending from the front side 33 to the backside 34. A first substrate conductor 45a and second substrate conductor 45b are shown in FIG. 2, although any suitable number of substrate conductors may be used within the scope of the present invention. In embodiments, the first substrate conductor 45a and second substrate conductor 45b each pass entirely through the substrate 10, as well as buried insulator layer 15, and semiconductor layer 20. In additional embodiments, the first substrate conductor 45a and second substrate conductor 45b each pass through the insulator layer 35 in addition to the substrate 10.

The first substrate conductor 45a and second substrate conductor 45b may each comprise, for example, a respective through-silicon-via (TSV) (also referred to as a through-substrate-via) formed using semiconductor manufacturing processes including masking, etching, and deposition. For example, in forming the first substrate conductor 45a and second substrate conductor 45b, a photomask may provided by forming a layer of photoresist material on the insulator layer 35, exposing the photoresist material to a pattern of light, and developing the exposed photoresist material. An etching process, such as one or more reactive ion etch (RIE) processes, may then be used to form patterns (e.g., openings) extending from the top surface of the insulator layer 35 to the backside 34 of the substrate 10 (e.g., through the insulator layer 35, semiconductor layer 20 and/or isolation regions 30, buried insulator layer 15, and substrate 10) by removing material not covered by the photomask. After etching, the photomask may be removed using a conventional ashing or stripping process.

A first deposition process, such as chemical vapor deposition (CVD) or atomic layer deposition (ALD), may then be used to line the patterns (openings) with a film 50 of electrical insulator material, such as, for example, $SiO_2$. A second deposition process, such as CVD, ALD, sputter deposition, or electroplating (or combinations of these), may then be used to fill the remainder (e.g., central portion, core, etc.) of the patterns (openings) with a electrically conductive material 55 including, e.g., copper (Cu) or other suitable material. A planarization process, such as chemical mechanical polish (CMP), may be used to remove material from the top surface of the structure and/or the backside 34 of the substrate 10 to form substantially planar surfaces.

Figure 3:
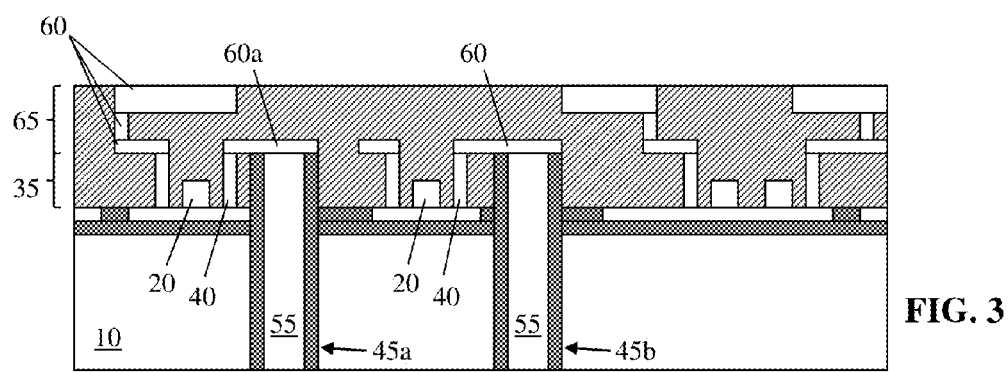

As shown in FIG. 3, any number and arrangement of electrically conductive elements 60, such as wires, vias, and/or interconnects, may be formed in one or more interlevel dielectric (ILD) layers 65 over the insulator layer 35. In embodiments, at least one of the conductive elements (e.g., 60a) directly contacts and forms an electrically conductive pathway between: (i) the conductive material 55 of one of the substrate conductors (e.g., first substrate conductor 45a) and (ii) a contact 40 associated with one of the devices 25. The conductive elements 60 and ILD layers 65 may be formed using conventional semiconductor manufacturing processes and materials such as deposition of material, photolithography and etching processes known to those of skill in the art, as already described herein.

Figure 4:
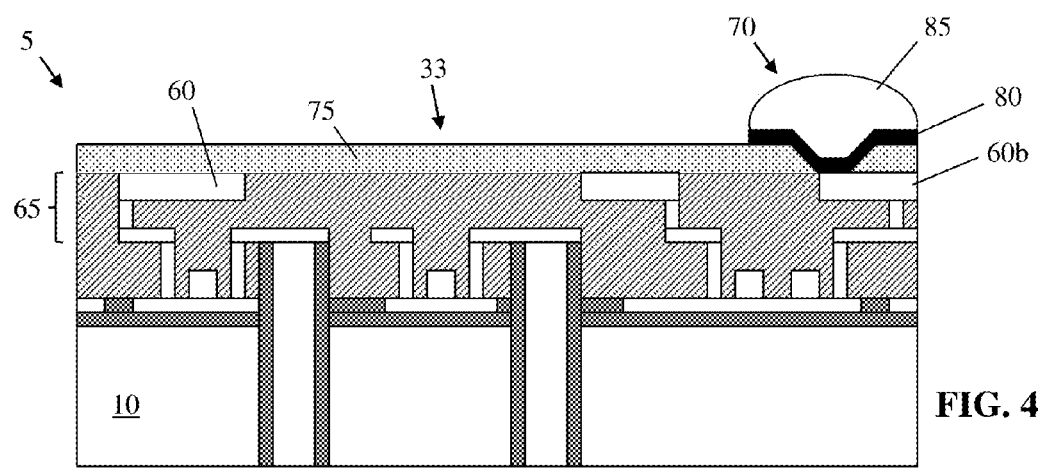

As shown in FIG. 4, one or more external electrical connections 70 may be formed on the last wiring level of the semiconductor structure 5, e.g., at the front side 33 and on top of the uppermost portions of the conductive elements 60 and ILD layers 65. For example, a passivation layer 75 may be formed on the last wiring level of the semiconductor structure 5, an opening may be formed in the passivation layer 75 to expose a portion of a conductive element 60b, a bond pad 80 may be formed in the opening and contacting the portion of a conductive element 60b, and a solder ball 85 may be formed on the bond pad 80. The passivation layer 75, bond pad 80, and solder ball 85 may be formed using conventional semiconductor processing techniques and materials.

Figure 5:
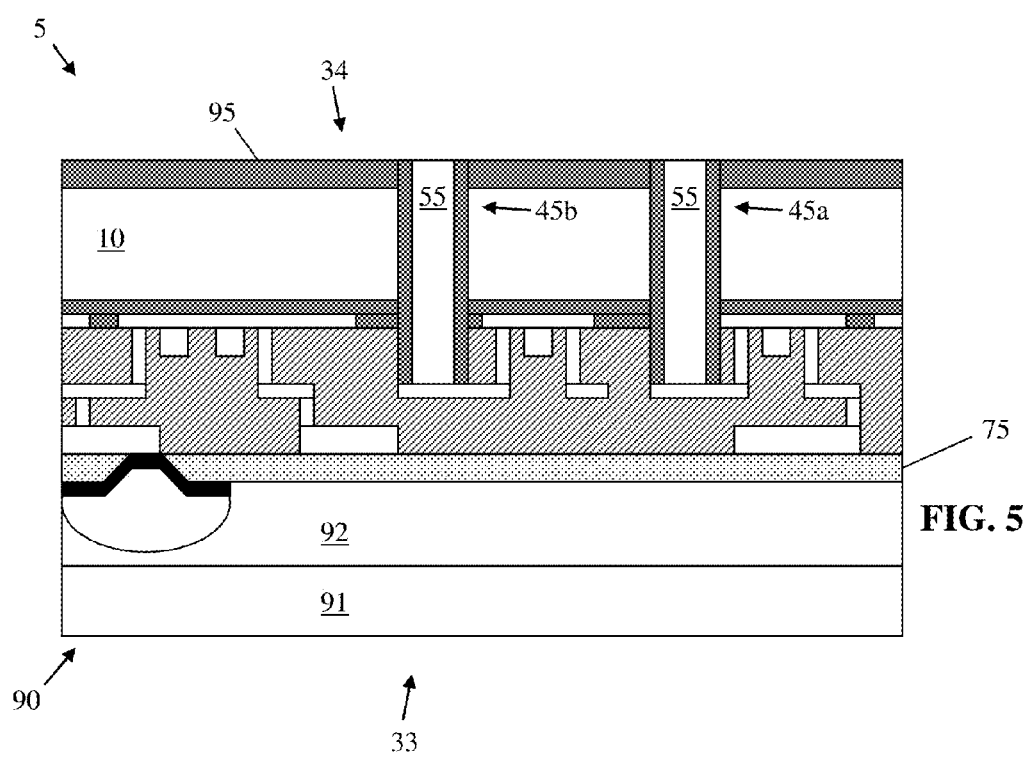

FIG. 5 shows CMOS processing at the backside 34 of the semiconductor structure 5 in accordance with aspects of the invention. In embodiments, a handle wafer 90 is attached to the top surfaces at the front side 33. For example, the handle wafer 90 may comprise a semiconductor or glass material 91 attached to the passivation layer 75 by an adhesive 92, as is understood by those of ordinary skill in the art such that further explanation is not necessary. The handle wafer 90 may be used to re-orient (e.g., flip, rotate, etc.) the semiconductor structure 5 to facilitate processing at the backside 34.

As depicted in FIG. 5, a backside insulator layer 95 is formed on the backside 34 of the substrate 10. In embodiments, the backside insulator layer 95 is formed by first grinding the backside 34 (e.g., a backside grind), recessing a portion of the backside 34 of the substrate 10 relative to the first substrate conductor 45a and second substrate conductor 45b, and filling the recess with an insulator material. The backside 34 may be recessed using, for example, an etch process having a chemistry that removes material of the substrate 10 without substantially removing materials of the first substrate conductor 45a and second substrate conductor 45b. For example, when the substrate comprises silicon (Si), the backside 34 may be recessed with an Si recess etch that is selective to the materials of the first substrate conductor 45a and second substrate conductor 45b. The depth of the recess at the backside 34 may be controlled by controlling the duration of the recess etch. After forming the recess, the backside insulator layer 95 may be formed by depositing an insulator material, e.g., $SiO_2$ deposited using CVD, in the recess. A polishing process, e.g., CMP, may then be used to planarize the backside insulator layer 95 and remove any of the insulator material that was deposited on the first substrate conductor 45a and second substrate conductor 45b, i.e., to ensure that the conductive material 55 is exposed at the backside 34.

Figure 6:
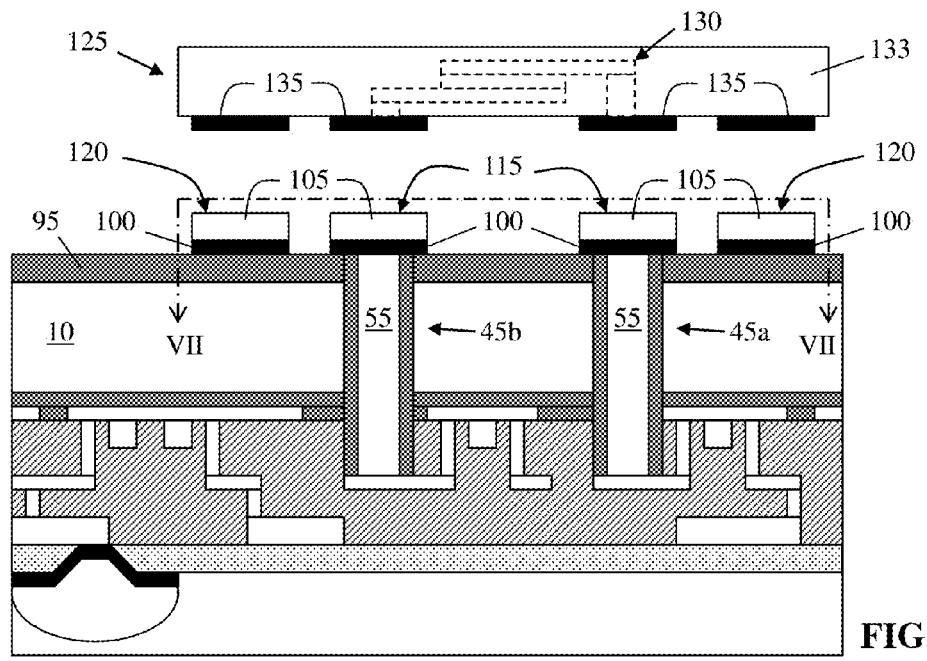
Figure 7:
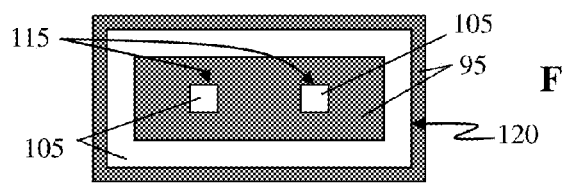

As shown in FIGS. 6 and 7, under-bump metallurgy (UBM) 100 is formed at locations on the backside insulator layer 95, and solder 105 is formed on the UBM 100. In embodiments, the UBM 100 and solder 105 are formed at first locations 115 in contact with the conductive material 55 of the first substrate conductor 45a and second substrate conductor 45*b*, and at second locations 120 not in contact with the conductive material 55. In accordance with aspects of the invention, the UBM 100 and solder 105 at the first locations 115 provide solder bumps for connecting an RF device 125 to the first substrate conductor 45*a* and second substrate conductor 45*b*. The UBM 100 and solder 105 at the second locations 120 provides a solder ring for forming a seal surrounding the solder bumps at the first locations 115.

FIG. 7 is a plan view along line VII-VII of FIG. 6, and shows the solder 105 at the first locations 115 and second locations 120, as well as portions of the backside insulator layer 95. In embodiments, the solder 105 at the second locations 120 provides a continuous solder ring (e.g., in the shape of a polygon, circle, ellipse, oval, etc.) around the first locations 115.

The UBM 100 and solder 105 may comprise any suitable materials. For example, the UBM 100 may comprise a first layer of titanium-tungsten (TiW) formed on the backside insulator layer 95 and/or conductive material 55, and a second layer of gold (Au) formed on the TiW, although any other materials may be used. The solder 105 may comprise, for example, gold (Au) and/or tin (Sn), although any other materials may be used.

The UBM 100 and solder 105 may be formed using any suitable processing techniques. In a first illustrative example, the UBM 100 is formed by sputtering a blanket layer of TiW on the backside insulator layer 95 and conductive material 55, and sputtering a blanket layer of about 100 nm of Au on the TiW. A resist mask is formed on the Au and patterned to form openings where solder is to be formed, e.g., at the first locations 115 and second locations 120. The solder 105 is formed in the openings in the resist mask by electroplating about 50 nm of Sn on the exposed Au, and then electroplating about 300 nm of Au on the Sn. The resist mask is stripped, and the exposed portions of the UBM 100 are etched using a wet etch or dry etch, leaving discrete shapes of UBM 100 and solder 105 at the first locations 115 and second locations 120. In a second illustrative example, the UBM 100 and solder 105 are formed by first forming a liftoff mask, e.g., a resist material patterned with openings at the first locations 115 and second locations 120. The UBM 100 and solder 105 are formed in the openings of the liftoff mask by sputtering respective layers of material, e.g., TiW/Au/AuSn, etc., in the openings. The liftoff mask is then stripped, leaving discrete shapes of UBM 100 and solder 105 at the first locations 115 and second locations 120.

Still referring to FIG. 6, the RF device 125 may comprise an already-formed band-pass filter 130, such as a SAW filter or BAW filter, arranged on or encapsulated in a polymer or epoxy material 133. The RF device 125 may comprise UBM 135 structured and arranged in a corresponding spatial location to the UBM 100 and solder 105. The UBM 135 may comprise the same materials as UBM 100, such as TiW/Au, formed using sputtering, masking, and etching processes as already described herein.

Figure 8:
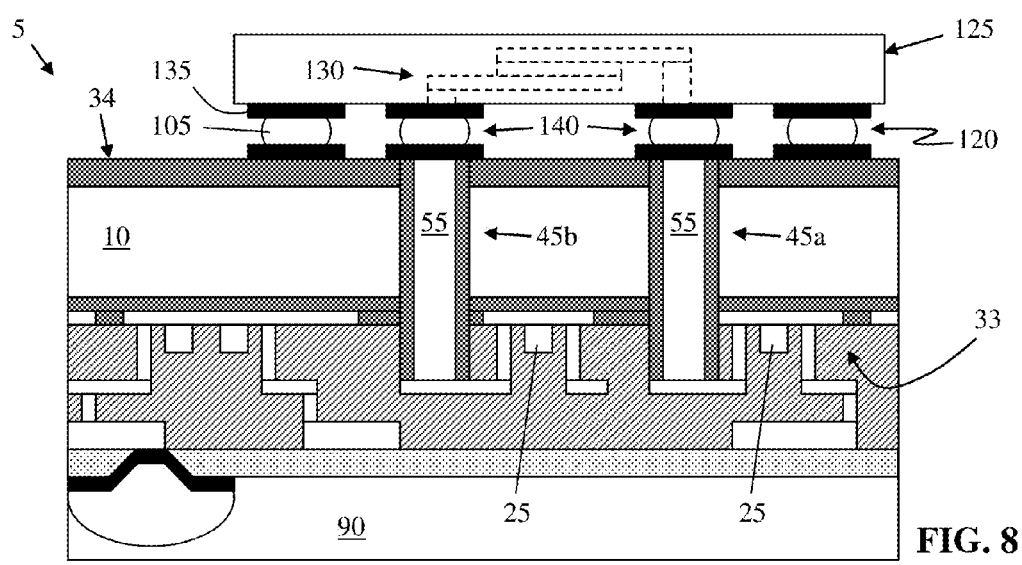

As shown in FIG. 8, the RF device 125 is bonded to the semiconductor structure 5 by bringing the UBM 135 into contact with the solder 105 and reflowing the solder 105. In this manner, the RF device 125 is bonded at the backside 34 of the substrate 10, and the first substrate conductor 45*a* and second substrate conductor 45*b* electrically couple the band-pass filter 130 to the at least one device 25 at the front side 33 of the substrate 10. Moreover, the solder 105 at the second locations 120 forms a seal around the electrical connections 140 between the RF device 125 and the first substrate conductor 45*a* and second substrate conductor 45*b*. Following bonding the RF device 125 to the semiconductor structure 5, further processing may be performed, such as removing the handle wafer 90 (including the material 91 and adhesive 92), applying dicing tape at the backside 34, and dicing the wafer from the front side 33.

Figure 9:
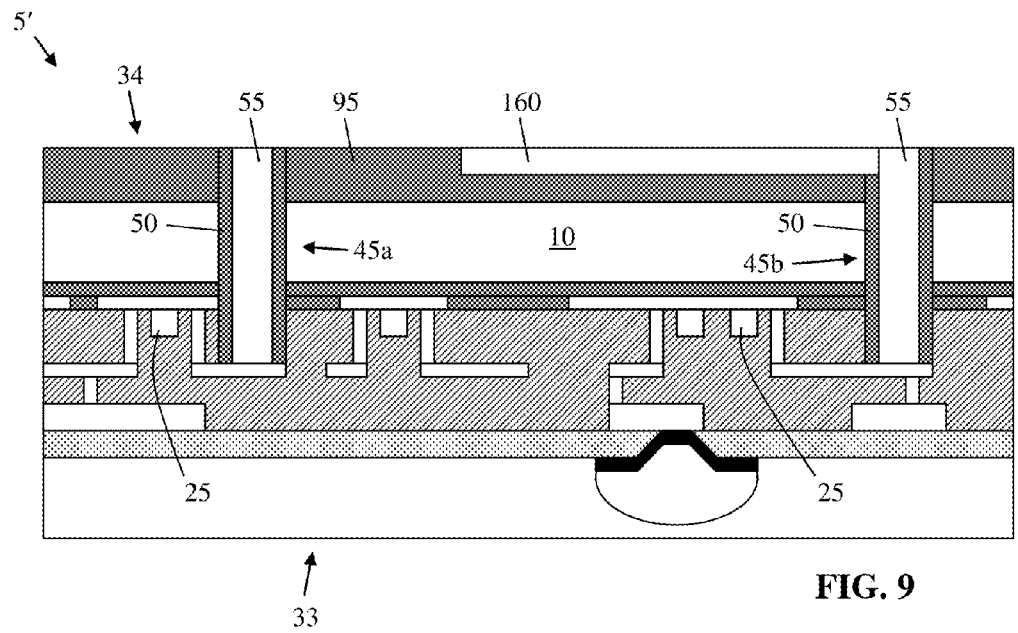

FIG. 9 shows an intermediate structure and respective fabrication steps in accordance with additional aspects of the present invention. In particular, FIG. 9 shows a semiconductor structure 5' that has undergone CMOS processing similar to the structure shown in FIGS. 1-5. For example, the semiconductor structure 5' of FIG. 9 comprises a substrate 10, at least one device 25 at a front side 33 of the substrate 10, a backside insulator layer 95 at a backside 34 of the substrate 10, and a first substrate conductor 45*a* and a second substrate conductor 45*b* extending from the front side 33 to the backside 34. Each of the first substrate conductor 45*a* and second substrate conductor 45*b* comprises a conductive material 55 (e.g., a conductive core) surrounded by an insulator film 50.

As depicted in FIG. 9, a backside interconnect 160 is formed in the backside insulator layer 95 and in contact with the conductive material 55 of the second substrate conductor 45*b*. The backside interconnect 160 comprises electrically conductive material and may be formed using conventional processing techniques. For example, the backside interconnect 160 may be formed using photolithographic masking and etching to form a trench (e.g., by etching portions of the backside insulator layer 95 and insulator film 50 of the second substrate conductor 45*b*), depositing a conductive material in the trench (e.g., sputter deposition of a seed layer followed by electroplating to deposit Cu), and performing a CMP process.

Figure 10:
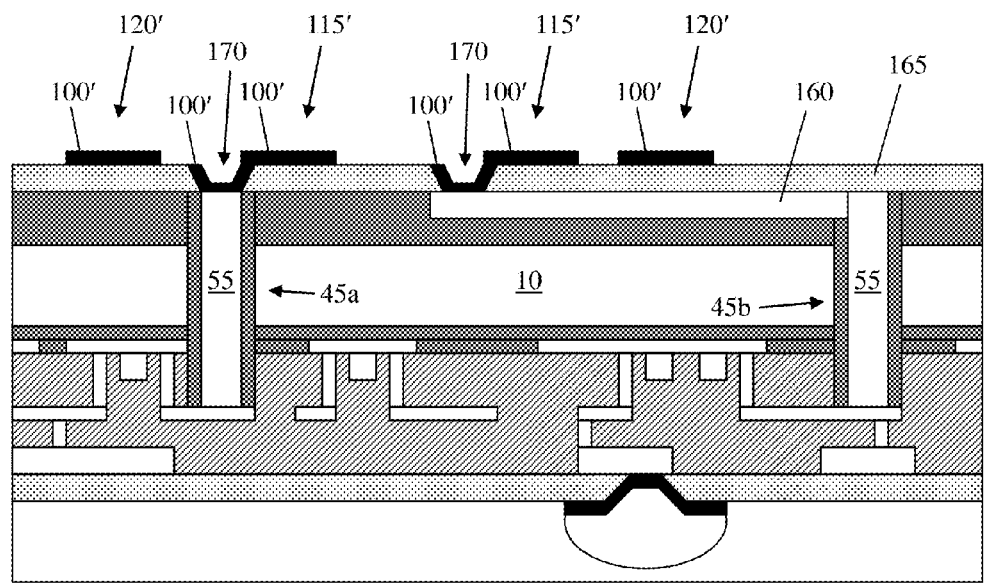

As depicted in FIG. 10, a passivation layer 165 is formed on the backside 34, covering the backside insulator layer 95, backside interconnect 160, first substrate conductor 45*a* and second substrate conductor 45*b*. The passivation layer 165 may comprise any suitable materials, such as a first layer of SiN and a second layer of $SiO_2$ formed by, e.g., CVD. The passivation layer 165 may be patterned (e.g., using masking and etching) to form openings 170 (e.g., tapered vias) that expose portions of the backside interconnect 160 and the conductive material 55 of the first substrate conductor 45*a*.

Still referring to FIG. 10, a UBM 100' is formed in the openings 170 and on portions of the passivation layer 165. The UBM 100' may be formed in a manner similar to that described with respect to UBM 100. For example, the UBM 100' may be formed by sputtering blanket layers of TiW and Au and patterning the layers using masking and etching. As another example, the UBM 100' may be formed by forming and patterning a liftoff mask, sputtering layers of TiW and Au in the openings in the liftoff mask, and then stripping the liftoff mask. Similar to UBM 100, the UBM 100' is formed at first locations 115' and second locations 120' that surround the first locations 115'. As depicted in FIG. 10, the first locations 115' include the openings 170 in the passivation layer 165 such that the UBM 100' contacts the backside interconnect 160 and the conductive material 55 of the first substrate conductor 45*a*. Moreover, the first locations 115' extend outward from the openings 170 such that the UBM 100' continuously extends from the openings 170 to an outer surface of the passivation layer 165.

Figure 11:
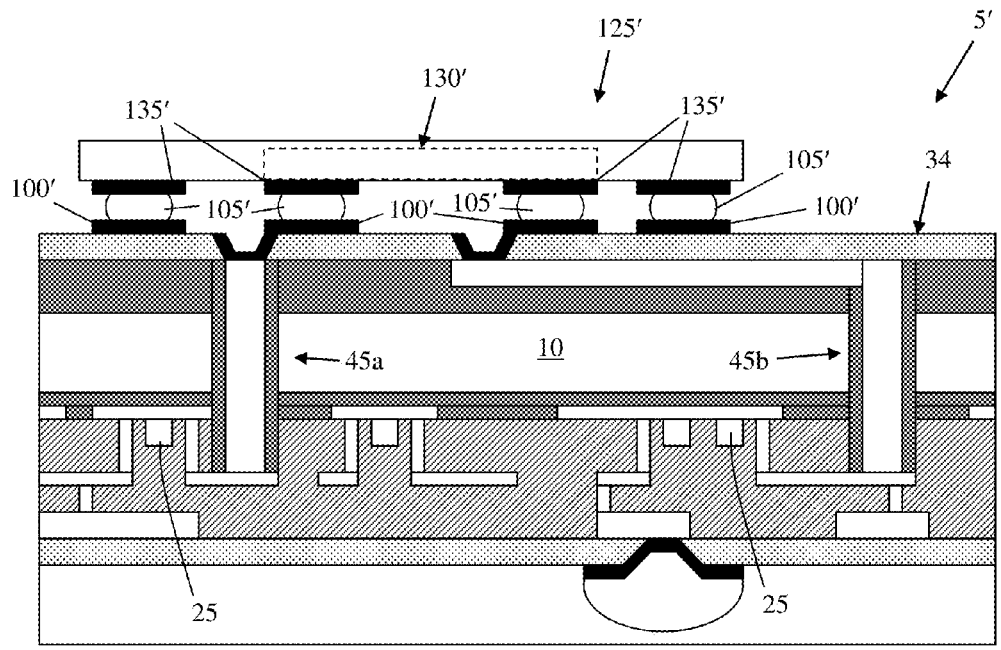

As depicted in FIG. 11, and in accordance with aspects of the invention, an RF device 125' is bonded to the backside 34 of semiconductor structure 5'. In embodiments, the RF device 125' comprises a filter 130' (e.g., a SAW or BAW filter) and UBM 135' structured to spatially correspond to UBM 100'. The RF device 125' is bonded to the backside 34 of semiconductor structure 5' by forming solder 105' on the UBM 100', bringing the UBM 135' into contact with the solder 105' and reflowing the solder 105'. In this manner, the filter 130' at the backside 34 is electrically coupled to at least one device 25 at the front side 33 by the first substrate conductor 45a and second substrate conductor 45b. Subsequent processing may include, e.g., removing the handle wafer and dicing the semiconductor structure 5' (e.g., wafer).

Figure 12:
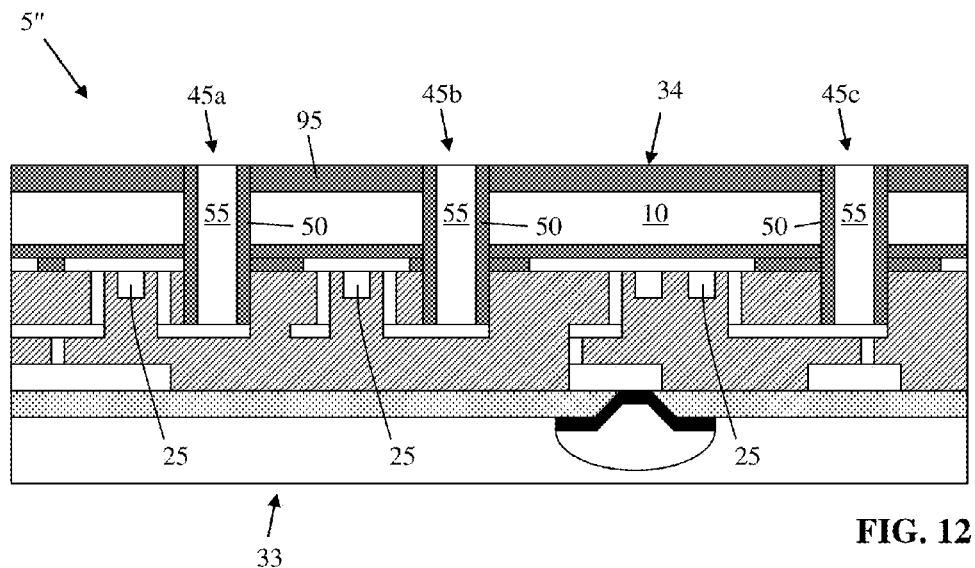

FIG. 12 shows an intermediate structure and respective fabrication steps in accordance with additional aspects of the present invention. In particular, FIG. 12 shows a semiconductor structure 5'' that has undergone CMOS processing similar to the structure shown in FIGS. 1-5. For example, the semiconductor structure 5'' of FIG. 12 comprises a substrate 10, at least one device 25 at a front side 33 of the substrate 10, a backside insulator layer 95 at a backside 34 of the substrate 10, and a first substrate conductor 45a and a second substrate conductor 45b extending from the front side 33 to the backside 34. Each of the first substrate conductor 45a and second substrate conductor 45b comprises a conductive material 55 (e.g., a conductive core) surrounded by an insulator film 50.

As depicted in FIG. 12, the semiconductor structure 5'' also comprises a third substrate conductor 45c that is similar to and laterally offset from the first substrate conductor 45a and second substrate conductor 45b. The third substrate conductor 45c may be formed simultaneously, e.g., using the same processes and materials, as the first substrate conductor 45a and second substrate conductor 45b.

Figure 13:
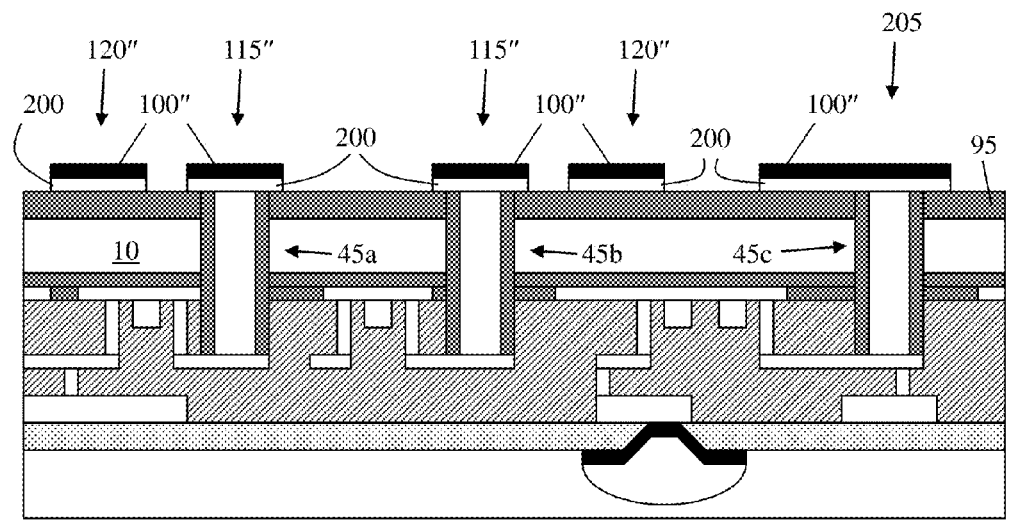

As shown in FIG. 13, a bond pad 200 is formed on portions of the backside insulator layer 95, first substrate conductor 45a, second substrate conductor 45b, and third substrate conductor 45c. The bond pad 200 may comprise any suitable conductive materials, such as layers of Ti, TiN, and Al. Furthermore, a UBM 100'' is formed on the bond pad 200. The UBM 100'' may be similar to UBM 100, and may comprise, for example, layers of TiW and Au. The bond pad 200 and UBM 100'' may be formed using processes already described herein, such as depositing respective layers of Ti, TiN, Al, TiW, and Au, and patterning the layers using photolithographic masking and etching. Alternatively, the bond pad 200 and UBM 100'' may be formed using a liftoff technique.

Similar to UBM 100, the bond pad 200 and UBM 100'' are formed at first locations 115'', and second locations 120'' that surround the first locations 115''. In embodiments, the bond pad 200 and UBM 100'' are also formed at a third location 205 over the third substrate conductor 45c. The bond pad 200 contacts the conductive material 55 of the first substrate conductor 45a and second substrate conductor 45b at the first locations 115''. Moreover, the bond pad 200 contacts the conductive material 55 of the third substrate conductor 45c at the third location 205.

Figure 14:
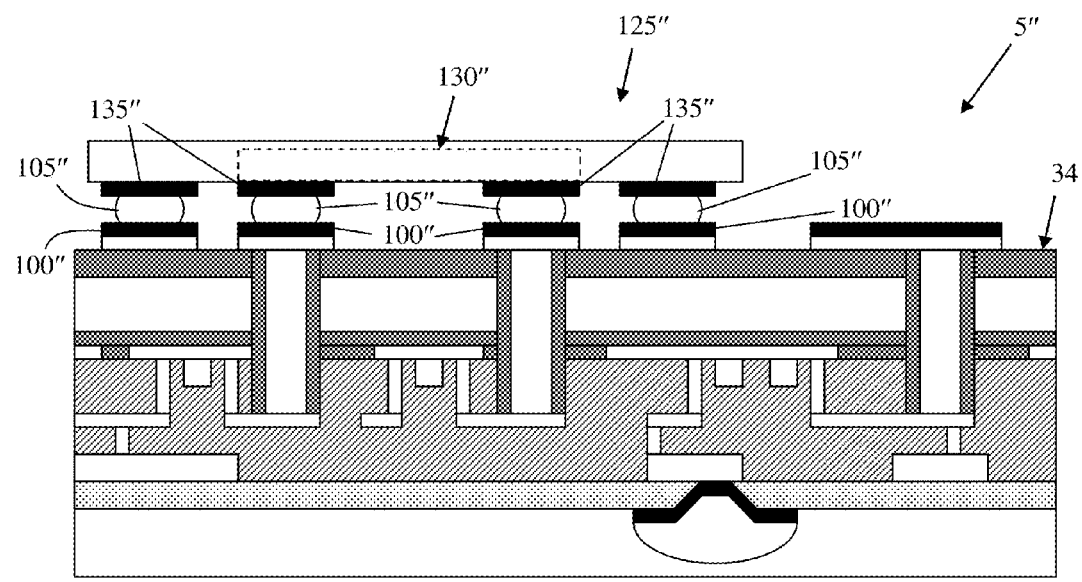

As depicted in FIG. 14, and in accordance with aspects of the invention, an RF device 125'' is bonded to the backside 34 of semiconductor structure 5''. In embodiments, the RF device 125'' comprises a filter 130'' (e.g., a SAW or BAW filter) and UBM 135'' structured to spatially correspond to UBM 100''. The RF device 125'' is bonded to the backside 34 of semiconductor structure 5'' by forming solder 105'' on the UBM 100'', bringing the UBM 135'' into contact with the solder 105'' and reflowing the solder 105''. In this manner, the filter 130'' at the backside 34 is electrically coupled to at least one device 25 at the front side 33 by the first substrate conductor 45a and second substrate conductor 45b.

Figure 15:
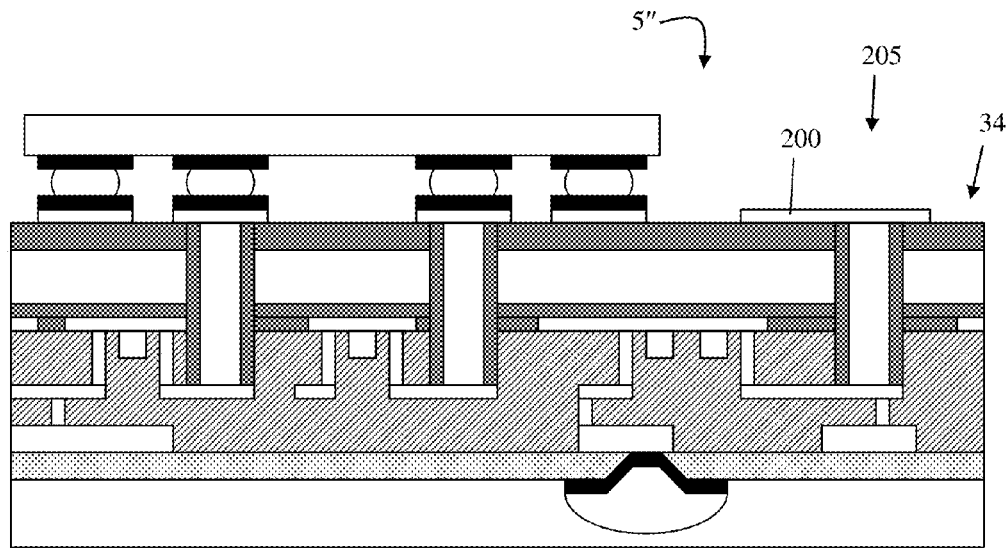

As depicted in FIG. 15, in embodiments, the UBM 100'' is removed from the bond pad 200 at the third location 205. A dry etch or a sputter etch may be used to remove the UBM 100'' from the bond pad 200, thereby exposing the bond pad 200 as an external contact point at the backside 34 of the semiconductor structure 5''. Subsequent processing may include, e.g., removing the handle wafer and dicing the semiconductor structure 5'' (e.g., wafer).

Figure 16:
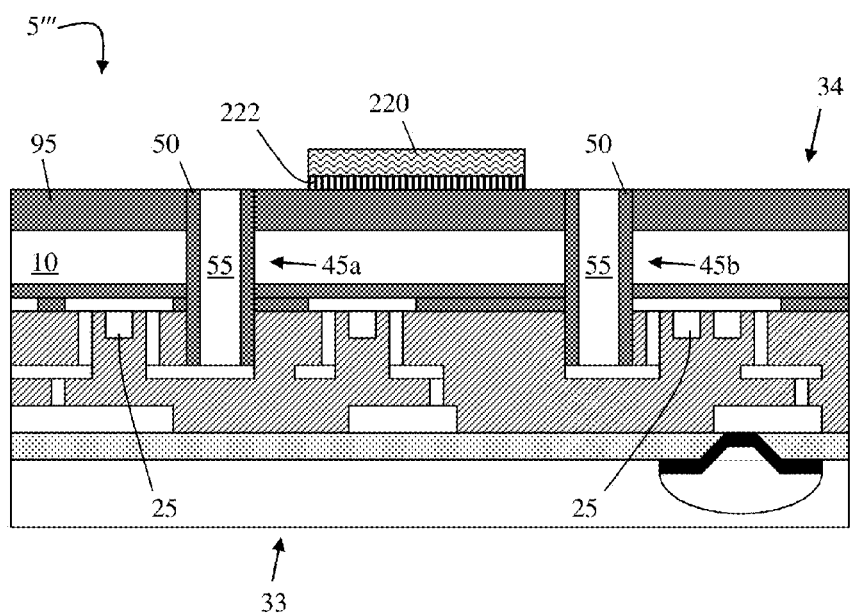

FIG. 16 shows an intermediate structure and respective fabrication steps in accordance with additional aspects of the present invention. In particular, FIG. 16 shows a semiconductor structure 5''' that has undergone CMOS processing similar to the structure shown in FIGS. 1-5. For example, the semiconductor structure 5''' of FIG. 16 comprises a substrate 10, at least one device 25 at a front side 33 of the substrate 10, a backside insulator layer 95 at a backside 34 of the substrate 10, and a first substrate conductor 45a and a second substrate conductor 45b extending from the front side 33 to the backside 34. Each of the first substrate conductor 45a and second substrate conductor 45b comprises a conductive material 55 (e.g., a conductive core) surrounded by an insulator film 50.

As depicted in FIG. 16, a piezoelectric material 220 is arranged on the backside insulator layer 95 at the backside 34 of the substrate 10. The piezoelectric material 220 may comprise any suitable material usable in a SAW filter, including, but not limited to zinc oxide (ZnO), zinc sulfide (ZnS), aluminum nitride (AlN), lithium tantalate (LiTaO$_3$) or other members of the lead lanthanum zirconate titanate family. The piezoelectric material 220 may be bonded to the backside insulator layer 95 using an epoxy and/or polymer adhesive 222, or may be bonded to the semiconductor structure 5''' in any other desired manner.

Figure 17:
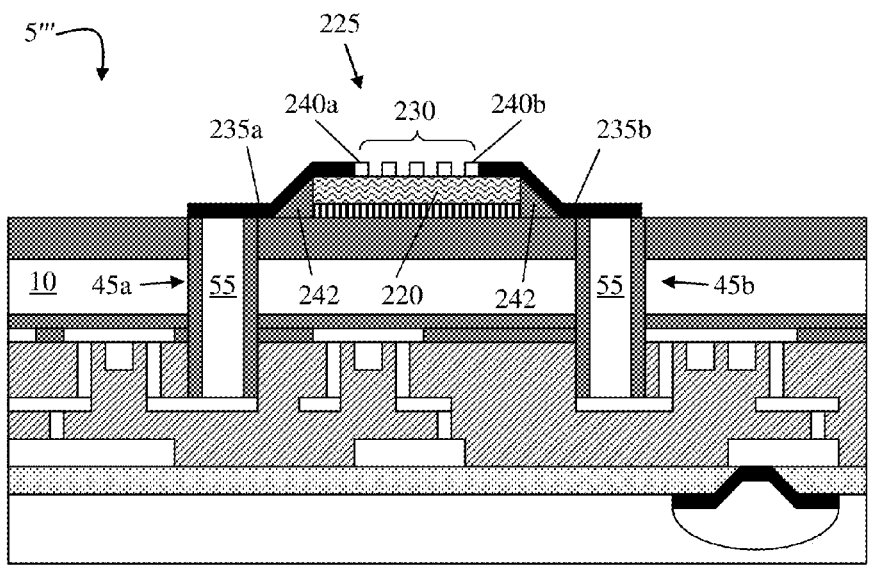

As depicted in FIG. 17, and in accordance with aspects of the invention, a SAW device 225 (e.g., a band-pass SAW filter) comprising electrically conductive lines 230 is formed on the piezoelectric material 220. The conductive lines 230 may be arranged in a pattern of a pair of comb-shaped electrodes having interdigitated fingers, as is understood by those of ordinary skill in the art (and depicted in greater detail herein with respect to FIG. 27). The conductive lines 230 may be formed using conventional semiconductor processing techniques, such as conventional deposition, masking, and etching processes. The conductive lines 230 may be composed of, for example, gold (Au), molybdenum (Mo), tungsten (W), copper (Cu), nickel (Ni), titanium (Ti), Niobium (Nb), silver (Ag), tantalum (Ta), cobalt (Co), aluminum (Al), or other conductive material.

As further depicted in FIG. 17, a first electrode 235a is formed extending continuously from the conductive material 55 of the first substrate conductor 45a to a first one of the combs 240a defined by the conductive lines 230. Also, a second electrode 235b is formed extending continuously from the conductive material 55 of the second substrate conductor 45a to a second one of the combs 240b defined by the conductive lines 230. The first electrode 235a and second electrode 235b may be formed using conventional semiconductor processing techniques, such as liftoff masking and deposition. The first electrode 235a and second electrode 235b may comprise any suitable conductive material, such as Al or Cu or other materials.

Still referring to FIG. 17, the semiconductor structure 5''' may optionally include angled (e.g., tapered) sidewall spacers 242 arranged on the sidewalls of the piezoelectric material 220. The sidewall spacers 242 may be composed of any suitable insulator material, such as polymer or nitride, and may be formed using conventional processing techniques. In embodiments, the sidewall spacers 242 are provided to improve the structural integrity of the first electrode 235a and second electrode 235b at the sidewalls of the piezoelectric material 220, e.g., by tapering the sharp vertical step otherwise present at the sidewalls of the piezoelectric material 220.

Figure 18:
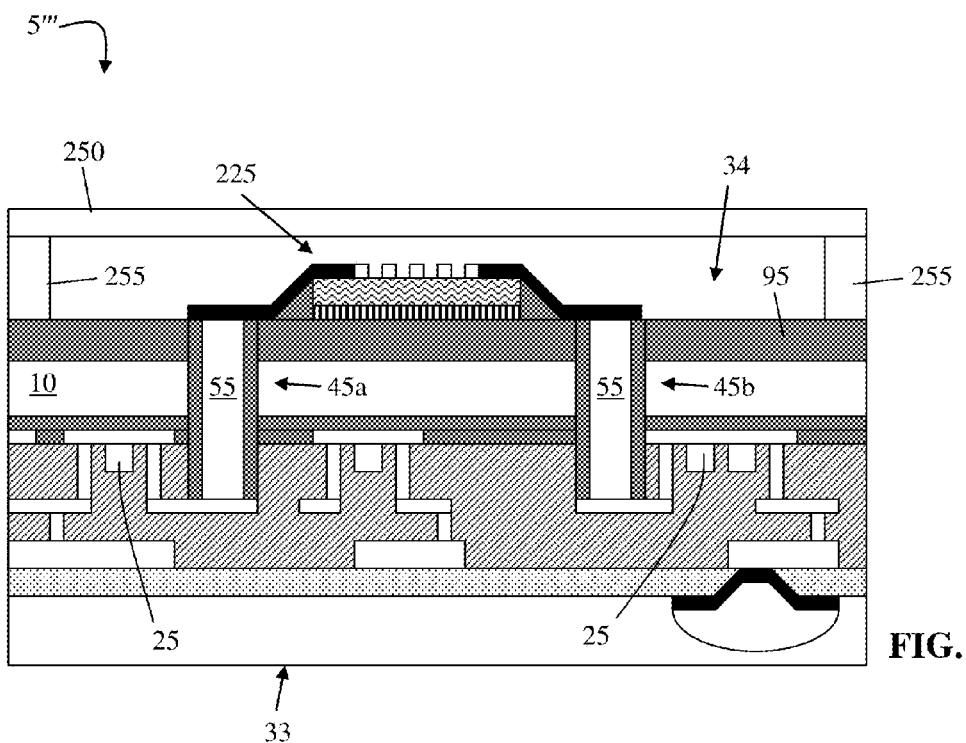

As depicted in FIG. 18, the SAW device 225 is hermetically sealed under a glass plate 250 that is bonded to the backside insulator layer 95 with a spacer 255. In embodiments, the spacer 255 surrounds the SAW device 225, e.g., forms a continuous perimeter around all lateral sides of the SAW device 225. The spacer 255 may comprise any desired material capable of bonding the glass plate 250 to the backside insulator layer 95, and also capable of providing a hermetic seal. For example, the spacer 255 may comprise a first layer of Au formed by sputter deposition or plating on the backside insulator layer 95, and a second layer of Sn formed by sputter deposition or plating on the first layer of Au. The one or more layers that make up the spacer 255 may be formed in a ring shape (e.g., polygon, circular, elliptical, etc.) using conventional liftoff masking and deposition processes. The glass plate 250 may be bonded to the spacer 255 by bringing the glass plate 250 into physical contact with the spacer 255 and annealing the structure.

As should now be understood, and as depicted by FIGS. 16-18, the SAW device 225 is formed at the backside 34 of the substrate 10, and is electrically connected to devices 25 at the frontside 33 by the first substrate conductor 45a and second substrate conductor 45b. Furthermore, the SAW device 225 is integrated with the semiconductor structure 5''' at the wafer level, e.g., is completely formed during CMOS processing, rather than being separately formed and externally attached to a chip after CMOS processing.

Figure 19:
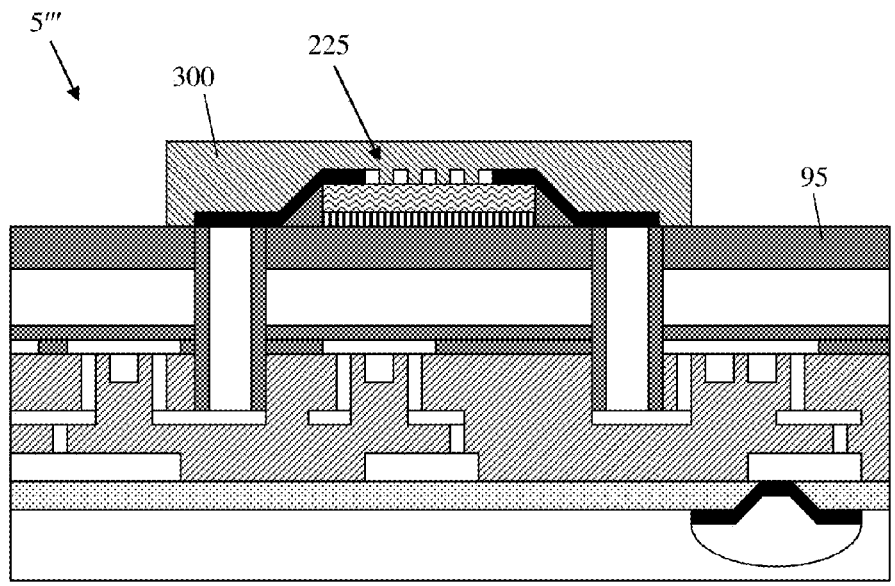

FIG. 19 shows an intermediate structure and respective fabrication steps in accordance with additional aspects of the present invention. In particular, FIG. 19 shows the semiconductor structure 5''' of FIG. 17 with a layer 300 of sacrificial material formed on and around (e.g., encapsulating) the SAW device 225 and also on portions of the backside insulator layer 95. The layer 300 of sacrificial material may be used in forming an alternative seal around the SAW device 225, rather than the glass plate and spacer shown in FIG. 18. In embodiments, the layer 300 of sacrificial material is composed of polymer (e.g., PMGI) or silicon; although other materials are also contemplated by the present invention. The layer 300 of sacrificial material may be formed using conventional semiconductor processing techniques, such as CVD, masking, and etching (e.g., for silicon) or masking and spin-on coating (e.g., for polymer).

Figure 20:
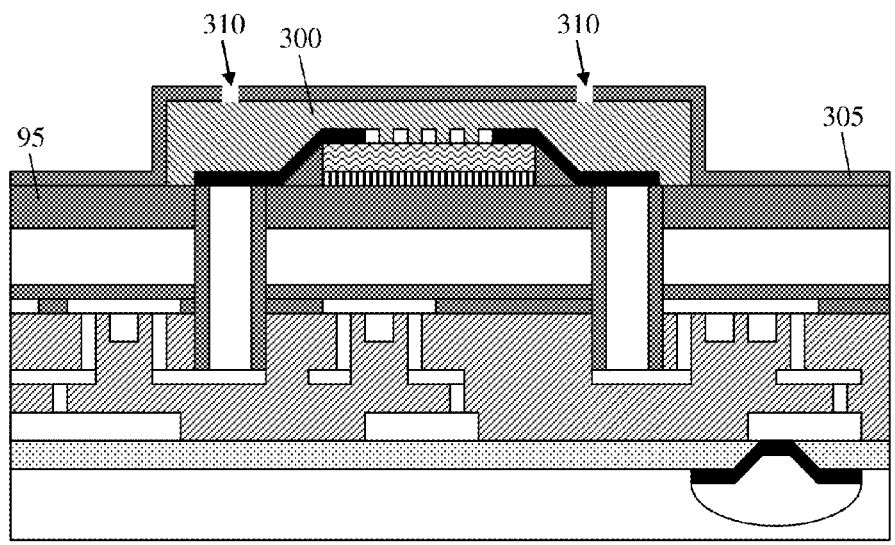

FIG. 20 shows the formation of a sealing layer 305 on the layer 300 of sacrificial material and on portions of the backside insulator layer 95 in accordance with aspects of the invention. In embodiments, the sealing layer 305 comprises $SiO_2$ or SiN, although any suitable sealing material may be used within the scope of the invention. The sealing layer 305 may be formed using, e.g., CVD.

Also shown in FIG. 20, at least one vent hole 310 is formed in the sealing layer 305 to expose the underlying layer 300 of sacrificial material. The vent hole 310 may be formed using conventional processing techniques, such as photolithographic masking and etching of the sealing layer 305. The size (e.g., width), shape, location, and/or number of vent holes 310 may be selected in accordance with design aspects described herein. In embodiments, the vent hole 310 may have a width of about 0.25 to 1.0 microns, although other dimensions may be used within the scope of the invention.

As should be understood by those of skill in the art, the width and height of the vent hole 310 determines the amount of material that should be deposited after removing the sacrificial materials to pinch off the vent hole 310. In general, the amount of material that should be deposited to pinch off the vent hole 310 decreases as the vent hole width decreases; and as the vent hole aspect ratio, which is the ratio of the vent hole height to width, increases. In embodiments, for example, the vent hole 310 is about 3 µm tall and 1 µm wide; although other dimensions are also contemplated by the present invention. In embodiments, the vent hole 310 may be circular or nearly circular, to minimize the amount of subsequent material needed to pinch it off.

Figure 21:
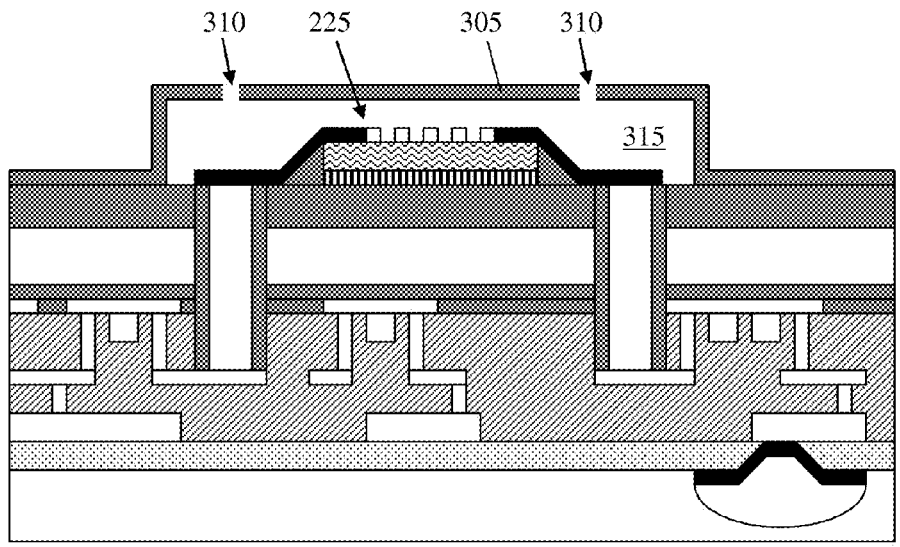

In accordance with aspects of the invention, and as shown in FIG. 21, the layer 300 of sacrificial material is removed by a venting process. In embodiments, the vent hole 310 is used for etching the layer 300 of sacrificial material through the sealing layer 305. For example, when the layer 300 of sacrificial material is composed of a polymer material, the vent hole 310 may be used as an access point for an oxygen plasma etch that removes the layer 300 of sacrificial material. As another example, when the layer 300 of sacrificial material is composed of silicon, the vent hole 310 may be used as an access point for a fluorine based dry etch (e.g., $XeF_2$ etch) that removes the layer 300 of sacrificial material. Removal of the layer 300 of sacrificial material forms a cavity 315 around the SAW device 225.

Figure 22:
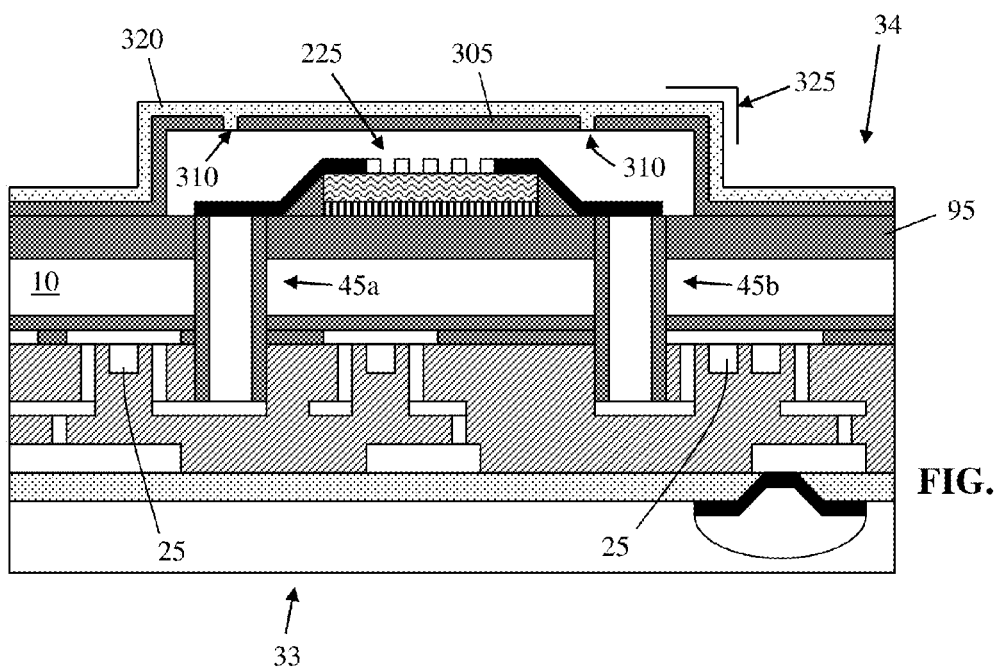

FIG. 22 shows the formation of a second sealing layer 320 in accordance with aspects of the invention. In embodiments, the second sealing layer 320 is formed on the sealing layer 305 and over the at least one hole 310. The second sealing layer 320 plugs the at least one hole 310, such that the SAW device 225 is sealed within the combination of the backside insulator layer 95, sealing layer 305, and second sealing layer 320. In this manner, the SAW device 225 is formed and sealed (e.g., encapsulated) on the back side 34 of the substrate 10, and is in electrical contact with devices 25 on the front side 33 by way of first substrate contact 45a and second substrate contact 45b. Still referring to FIG. 22, an optional layer 325 can also be deposited to provide a hermetic seal such as, for example, a 500 nm PECVD silicon nitride film or other films that provide a hermetic seal over second sealing layer 320.

Figure 23:
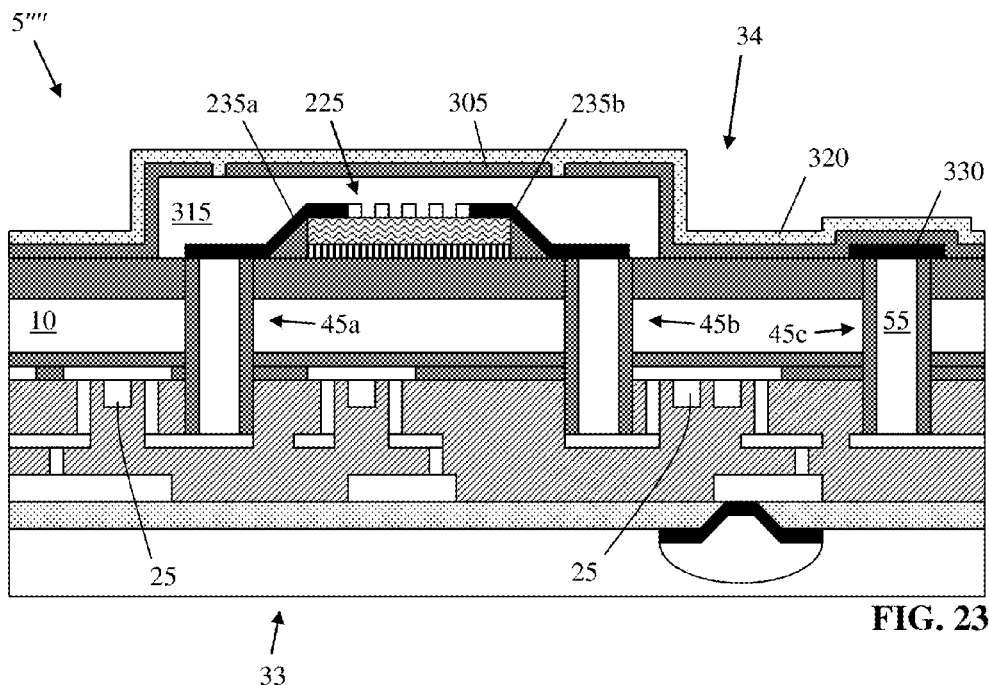
Figure 24:
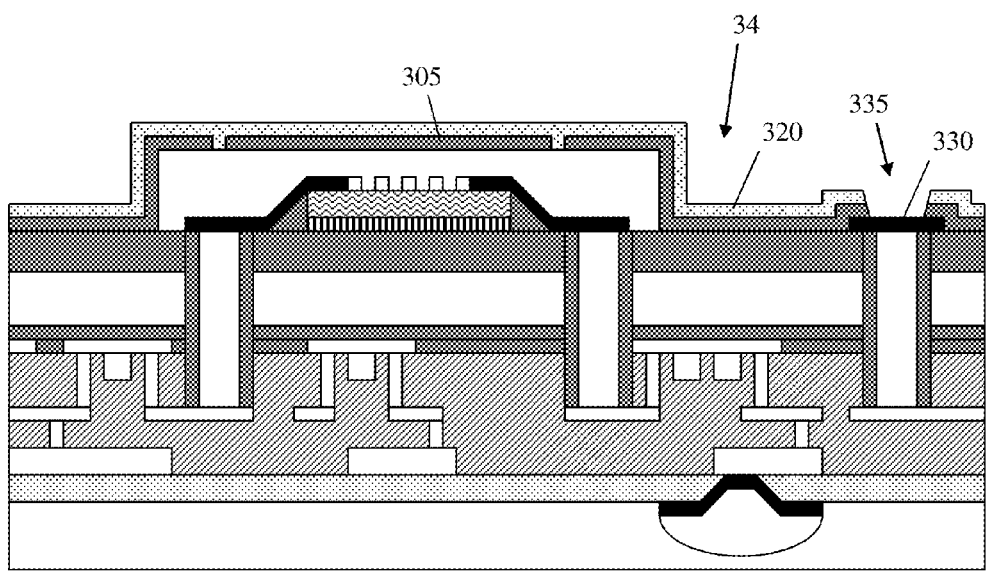

FIGS. 23 and 24 depict additional aspects of the invention. In particular, FIG. 23 shows a semiconductor structure 5'''' that has undergone CMOS processing similar to that described with respect to FIGS. 16, 17, and 19-22. For example, the semiconductor structure 5'''' shown in FIG. 23 comprises: a substrate 10 having a front side 33 and a backside 34, devices 25 formed at the front side 33, a SAW device 225 formed at the backside 34, a first substrate conductor 45a electrically connecting a first device 25 to a first electrode 235a of the SAW device 225, a second substrate conductor 45b electrically connecting a second device 25 to a second electrode 235a of the SAW device 225, a sealing layer 305, and a second sealing layer 320 encapsulating the SAW device 225.

As additionally shown in FIG. 23, the semiconductor structure 5'''' comprises a third substrate conductor 45c, which is similar to the first substrate conductor 45a and the second substrate conductor 45b. In accordance with aspects of the invention, the third substrate conductor 45c is located outside the footprint of the cavity 315 surrounding the SAW device 225.

Still referring to FIG. 23, in embodiments, a bond pad 330 is structured and arranged at the backside 34 in contact with the conductive material 55 of the third substrate conductor 45c. The bond pad 330 may be formed simultaneously with the first electrode 235a and second electrode 235a, e.g., formed using the same material (e.g., Al or Cu) during the same masking and deposition processes as a the first electrode 235a and second electrode 235a. As shown in FIG. 23, the bond pad 330 is covered by the sealing layer 305 and second sealing layer 320 during encapsulation of the SAW device 225.

As depicted in FIG. 24, an opening 335 is formed through the sealing layer 305 and second sealing layer 320 to expose a portion of the bond pad 330. The opening 335 may be formed using conventional masking and etching processes. In the manner, the exposed bond pad 330 provides an electrical contact at the backside 34 for external connections to the chip.

Figure 25:
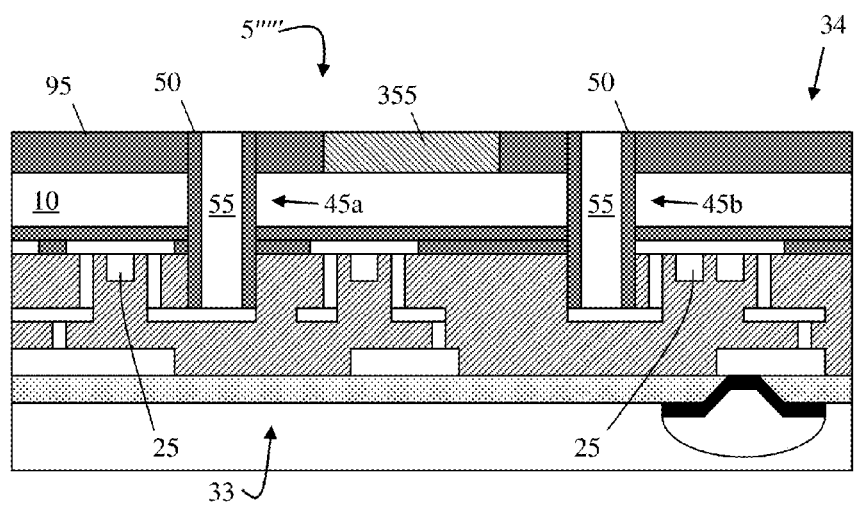

FIG. 25 shows an intermediate structure and respective fabrication steps in accordance with additional aspects of the present invention. In particular, FIG. 25 shows a semiconductor structure 5'''' that has undergone CMOS processing similar to the structure shown in FIGS. 1-5. For example, the semiconductor structure 5'''' of FIG. 25 comprises a substrate 10, at least one device 25 at a front side 33 of the substrate 10, a backside insulator layer 95 at a backside 34 of the substrate 10, and a first substrate conductor 45a and a second substrate conductor 45b extending from the front side 33 to the backside 34. Each of the first substrate conductor 45a and second substrate conductor 45b comprises a conductive material 55 (e.g., a conductive core) surrounded by an insulator film 50.

As additionally shown in FIG. 25, and in accordance with aspects of the invention, a sacrificial material 355 is formed in a trench in the backside insulator layer 95. In embodiments, the sacrificial material 355 is composed of a polymer or silicon, although other suitable materials may be used within the scope of the invention. The sacrificial material 355 may be formed in the backside insulator layer 95 using conventional processing techniques, such as photolithographic masking and etching the backside insulator layer 95, and depositing silicon or applying polymer with a spin-on process. A CMP process may be applied after forming the sacrificial material 355 in the backside insulator layer 95.

Figure 26:
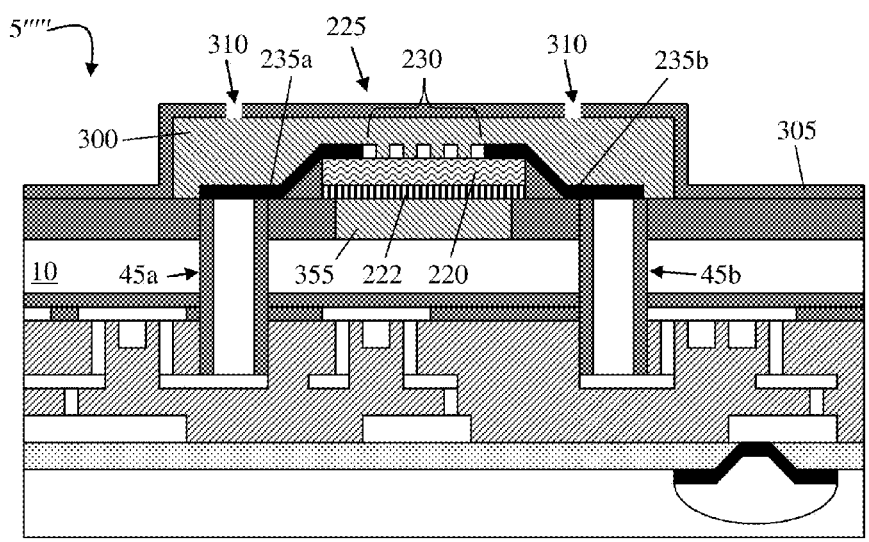

FIG. 26 shows the semiconductor structure 5'''' after performing CMOS processing similar to that described with respect to FIGS. 16, 17, 19, and 20. For example, a SAW device 225 comprising a piezoelectric material 220 is bonded over the sacrificial material 355 using an adhesive 222. The SAW device 225 comprises electrical conductive lines 230 connected respectively to first electrode 235a contacting the first substrate conductor 45a and a second electrode 235a contacting the second substrate conductor 45b. A layer 300 of sacrificial material is formed on and around the SAW device 225, and a sealing layer 305 with at least one vent hole 310 is formed on the layer 300 of sacrificial material. In embodiments, the sacrificial material 355 and the layer 300 of sacrificial material are composed of the same material, e.g., silicon or polymer.

Figure 27:
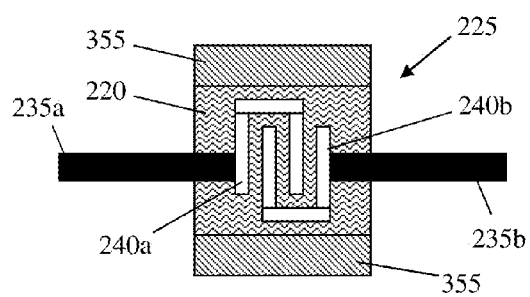

In accordance with aspects of the invention, the SAW device 225 does not cover the entire sacrificial material 355. For example, as shown in FIG. 27, which is a diagrammatic plan view of FIG. 26, the SAW device 225 only covers a portion of the sacrificial material 355, with exposed portions of the sacrificial material 355 extending laterally beside the piezoelectric material 220.

Figure 28:
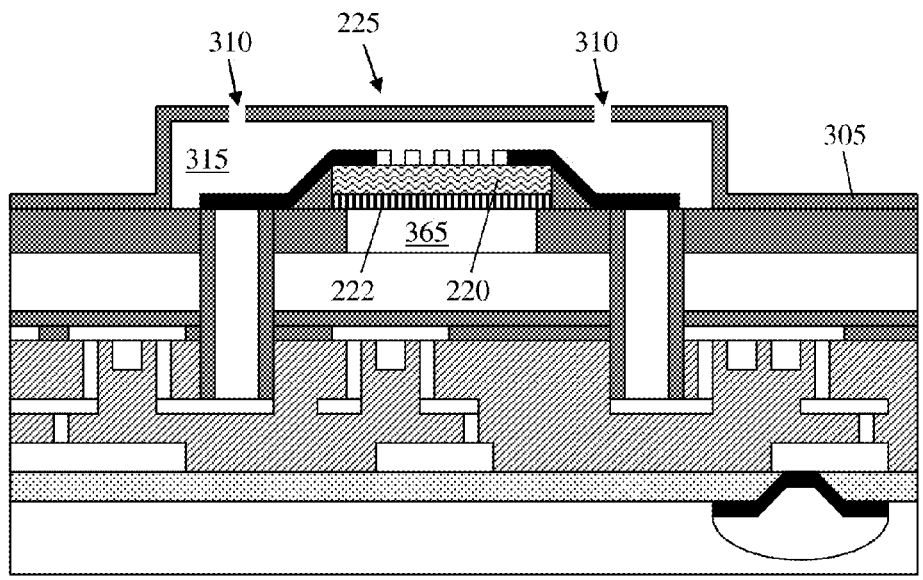

FIG. 28 shows removal of the layer 300 of sacrificial material and the sacrificial material 355. In embodiments, the vent hole 310 is used for etching the layer 300 of sacrificial material and the sacrificial material 355 through the sealing layer 305, e.g., in a manner similar to that described with respect to FIG. 21. For example, when the layer 300 of sacrificial material and the sacrificial material 355 are both composed of a polymer material, the vent hole 310 may be used as an access point for an oxygen plasma etch that removes the layer 300 of sacrificial material and the sacrificial material 355. As another example, when the layer 300 of sacrificial material and the sacrificial material 355 are both composed of silicon, the vent hole 310 may be used as an access point for a fluorine based dry etch (e.g., $XeF_2$ etch) that removes the layer 300 of sacrificial material and the sacrificial material 355.

Figure 29:
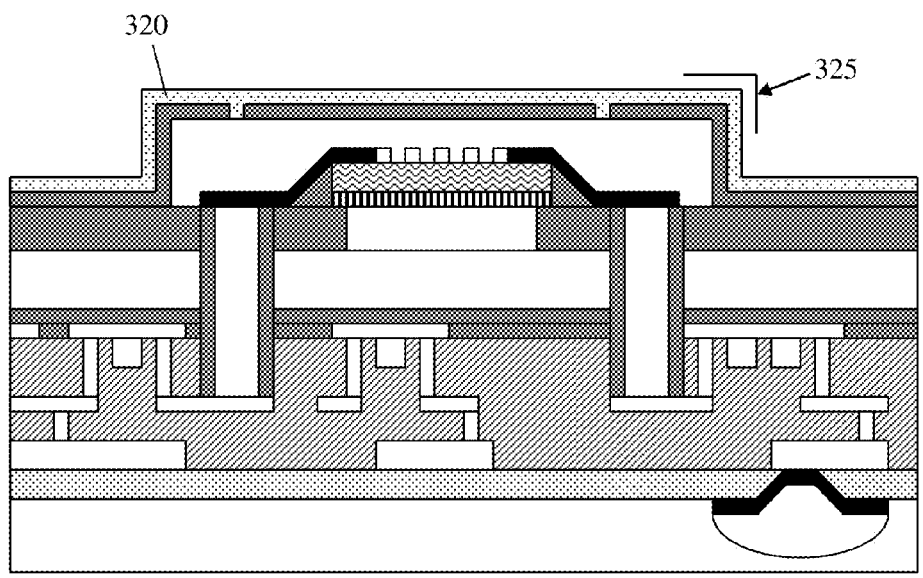

Removal of the layer 300 of sacrificial material and the sacrificial material 355 forms a lower cavity 365 and an upper cavity 315 around the SAW device 225. In embodiments, the SAW device 225 is structurally supported above the lower cavity 365 by edges of the adhesive 222 and piezoelectric material 220 resting on the backside insulator layer 95. As depicted in FIG. 29, the second sealing layer 320 and optional hermetic sealing layer 325 are formed, e.g., in the same manner as described with respect to FIG. 22.

Figure 30:
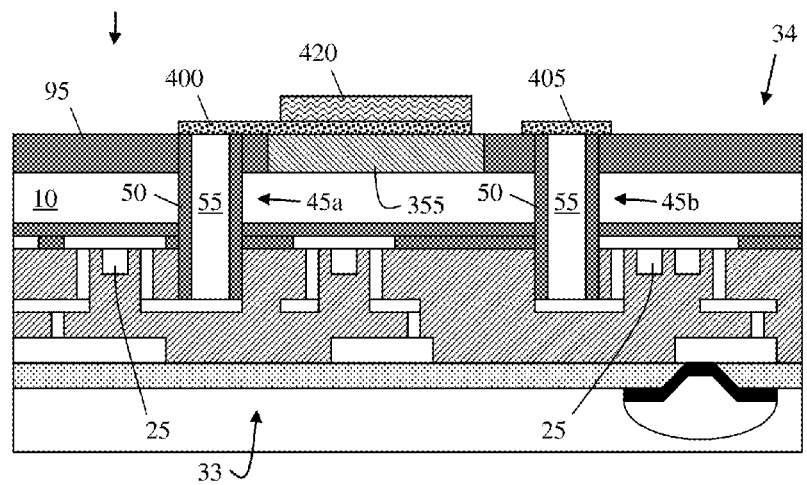

FIG. 30 shows an intermediate structure and respective fabrication steps in accordance with additional aspects of the present invention. In particular, FIG. 30 shows a semiconductor structure 5'''' that has undergone CMOS processing similar to the structure shown in FIG. 25. For example, the semiconductor structure 5'''' of FIG. 30 comprises a substrate 10, at least one device 25 at a front side 33 of the substrate 10, a backside insulator layer 95 at a backside 34 of the substrate 10, and a first substrate conductor 45a and a second substrate conductor 45b extending from the front side 33 to the backside 34. Each of the first substrate conductor 45a and second substrate conductor 45b comprises a conductive material 55 (e.g., a conductive core) surrounded by an insulator film 50. The semiconductor structure 5'''' of FIG. 30 also comprises the sacrificial material 355 formed in a trench in the backside insulator layer 95.

As additionally shown in FIG. 30, a first electrode 400 is formed on the backside insulator layer 95, sacrificial material 355, and conductive material 55 of the first substrate conductor 45a. Also, a pad 405 is formed on the conductive material 55 of the second substrate conductor 45b. Furthermore, a piezoelectric material 420 is formed on the first electrode 400. The first electrode 400 and pad 405 may be composed of the same material (e.g., platinum (Pt) or other suitable electrical conductor) and formed simultaneously in a deposition and patterning (e.g., masking, and etching) process.

The piezoelectric material 420 may be composed of, for example, zinc oxide (ZnO), zinc sulfide (ZnS), aluminum nitride (AlN), lithium tantalate ($LiTaO_3$) or other members of the lead lanthanum zirconate titanate family. The piezoelectric material 420 may be formed using conventional semiconductor processing techniques, such as a sputtering or deposition process to form a blanket (e.g., conformal layer) of material, and subsequent patterning of the material using conventional masking and etching processes.

Figure 31:
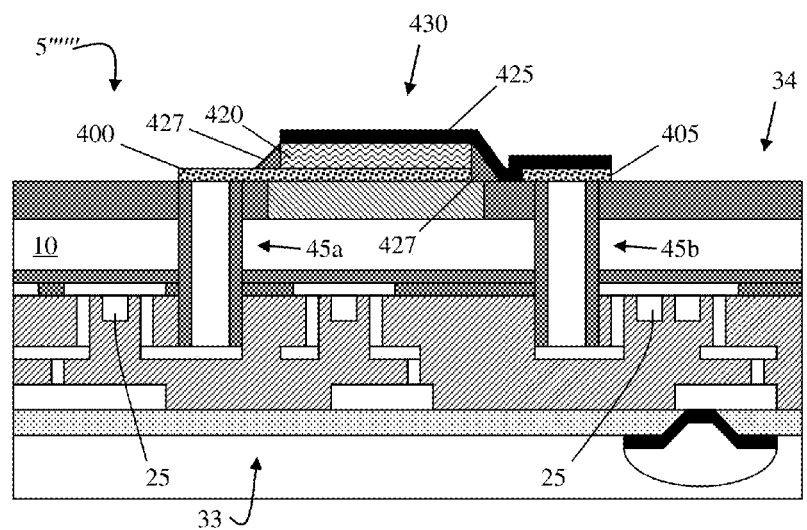

As depicted in FIG. 31, a second electrode 425 is formed on the pad 405 and the top of the piezoelectric material 420. The second electrode 425 may comprise any conductive material (e.g., Al) and may be formed using conventional processing techniques, such as deposition and patterning. Tapered sidewall spacers 427 may optionally be formed prior to the second electrode 425. When utilized, the sidewall spacers 427 may be formed in the manner described above with respect to FIG. 17.

In accordance with aspects of the invention, and as should be understood by one of ordinary skill in the art, the combination of the piezoelectric material 420, first electrode 400, and second electrode 425 constitutes a BAW device 430 (e.g., a band-pass BAW filter). The BAW device 430 is provided at the backside 34 of the substrate 10, and is electrically coupled to at least one device 25 at the front side 33 of the substrate by the first substrate conductor 45a and second substrate conductor 45b. Furthermore, the BAW device 430 is integrated with the semiconductor structure 5'''' at the wafer level, e.g., is completely formed during CMOS processing, rather than being separately formed and externally attached to a chip after CMOS processing.

Figure 32:
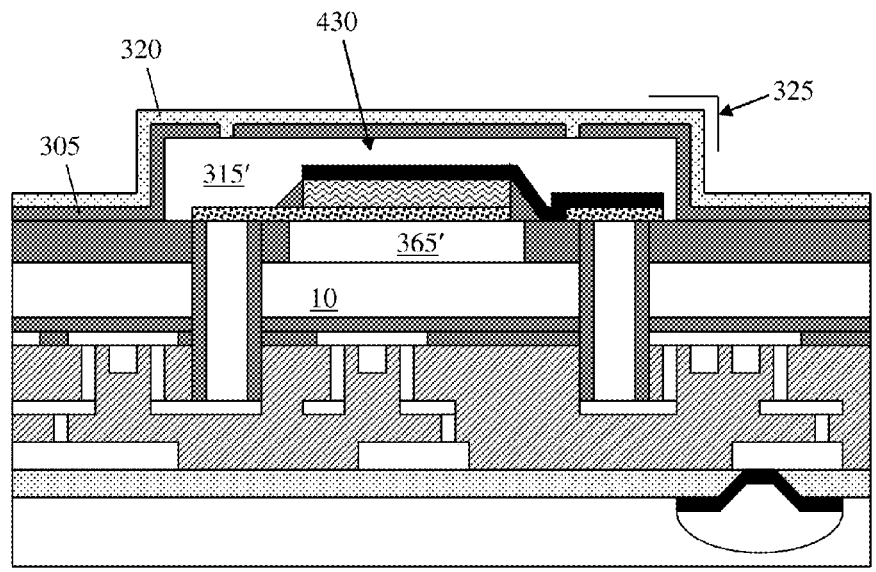
Figure 33:
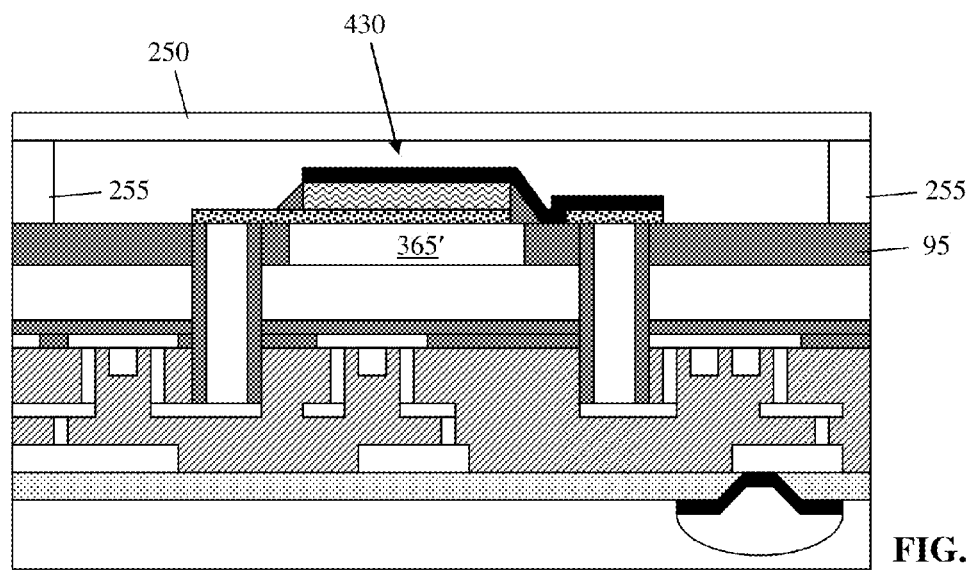

As depicted in FIG. 32, the BAW device 430 may be encapsulated (e.g., sealed) by forming sealing layer 305, second sealing layer 320, and optional sealing layer 325 in the manner described above with respect to FIGS. 26-29, including removing the sacrificial material 355 to form a lower cavity 365' between the BAW device 430 and the substrate 10. As depicted in FIG. 32, there is also an upper cavity 315' formed between the BAW device 430 and the sealing layer 305. Alternatively, as depicted in FIG. 33, the BAW device 430 may be encapsulated (e.g., sealed) by first removing (e.g., selectively etching) the sacrificial material 355, and then forming attaching a glass plate 250 to the backside insulator layer 95 using a spacer 255, e.g., in a manner similar to that described above with respect to FIG. 18. This results in a lower cavity 365' between the BAW device 430 and the substrate 10, as well as a cavity between the BAW device 430 and the glass plate 250.

Figure 34:
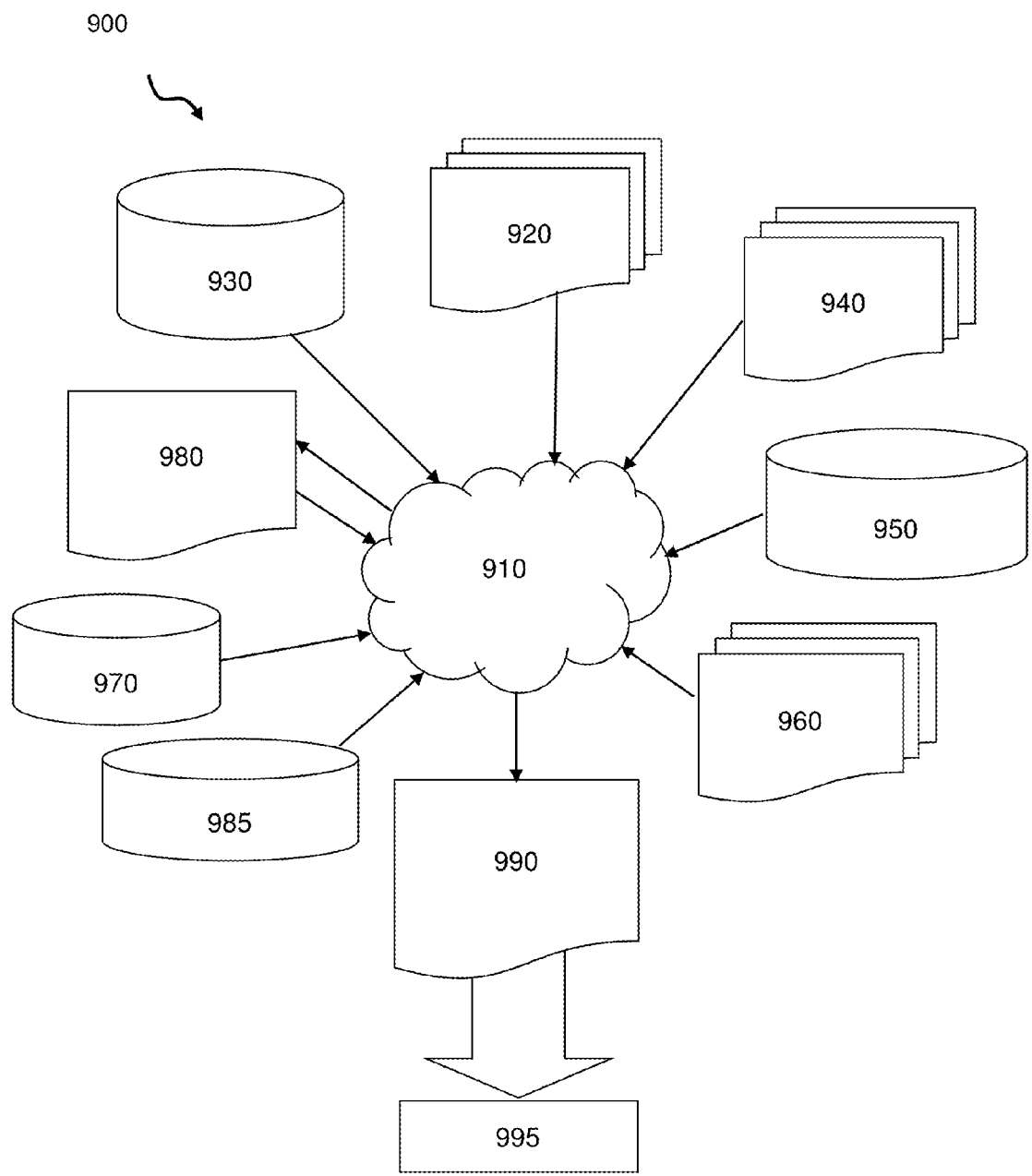
FIG. 34 is a flow diagram of a design process used in semiconductor design, manufacture, and/or test.

FIG. 34 is a flow diagram of a design process used in semiconductor design, manufacture, and/or test. FIG. 34 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-33. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 34 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-33. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-33 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-33. In one embodiment, design structure 990 may comprise a compiled, executable HDL simulation model that functionally simulates the devices shown in FIGS. 1-33.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-33. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims, if applicable, are intended to include any structure, material, or act for performing the function in combination with other claimed elements as specifically claimed. Moreover, while the invention has been described in terms of embodiments, those of ordinary skill in the art will recognize that the invention can be practiced with modifications and in the spirit and scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein

What is claimed:

1. A method, comprising:
   forming at least one device at a front side of a substrate;
   forming an insulator layer at the front side of the substrate and covering the at least one device;
   providing a radio frequency (RF) filter at a backside of the substrate; and
   forming at least one substrate conductor through the substrate and the insulator layer, wherein the at least one substrate conductor electrically couples the RF filter to the at least one device at the front side of the substrate,
   wherein the RF filter comprises a surface acoustic wave (SAW) filter; and
   the at least one substrate conductor comprises a first through-silicon-via connected to a first electrode of the SAW filter and a second through-silicon-via connected to a second electrode of the SAW filter.

2. The method of claim 1, wherein the forming at least one substrate conductor comprises forming the first and second through-silicon-vias from the front side to the backside of the substrate.

3. The method of claim 1, wherein the providing the RF filter comprises forming the surface acoustic wave (SAW) filter on the backside of the substrate.

4. A method, comprising:
   providing a radio frequency (RF) filter at a backside of a substrate; and
   forming at least one substrate conductor through the substrate, wherein the at least one substrate conductor electrically couples the RF filter to at least one device at a front side of the substrate;
   wherein the providing the RF filter comprises forming a surface acoustic wave (SAW) filter on the backside of the substrate; and
   the forming the SAW filter comprises:
      forming a backside insulator layer on the backside of the substrate;
      bonding a piezoelectric material to the backside insulator layer;
      forming a first and second interdigitated electrodes on the piezoelectric material;
      forming a first electrode contacting the first interdigitated electrode and a conductive material of a first one of the at least one substrate conductor; and
      forming a second electrode contacting the second interdigitated electrode and a conductive material of a second one of the at least one substrate conductor.

5. The method of claim 4, further comprising:
   electrically coupling the conductive material of the first one of the at least one substrate conductor to a first one of the at least one device that is formed on the front side of the substrate; and
   electrically coupling the conductive material of the second one of the at least one substrate conductor to a second one of the at least one device that is formed on the front side of the substrate.

6. The method of claim 1, further comprising forming an encapsulating seal around the RF filter at the backside of the substrate.

7. The method of claim 6, wherein the forming the encapsulating seal comprises:
   forming a spacer ring on the backside of the substrate around the RF filter; and bonding a glass plate to the spacer ring, wherein the RF filter is structured within a cavity defined by the glass plate and the spacer ring.

8. The method of claim 6, wherein the forming an encapsulating seal comprises:
   forming a sacrificial material on and around the RF filter;
   forming a first sealing layer on the sacrificial material;
   forming a vent hole in the first sealing layer;
   removing the sacrificial material through the vent hole; and
   forming a second sealing layer on the first sealing layer, wherein the second sealing layer plugs the vent hole; and
   the RF filter is structured within a cavity formed by removal of sacrificial material and defined by the first sealing layer and the second sealing layer.

9. The method of claim 1, further comprising forming a cavity that is: (i) under the RF filter and (ii) between the RF filter and the substrate.

10. The method of claim 1, wherein the providing the RF filter comprises bonding the RF filter to the backside of the substrate by:
    forming an under-bump metallurgy at a first location and in contact with a conductive portion of the at least one substrate conductor;
    forming a solder on the under-bump metallurgy;
    bringing the RF filter into contact with the solder; and
    reflowing the solder.

11. The method of claim 10, wherein the bonding the RF filter to the backside of the substrate further comprises:
    forming the under-bump metallurgy at a second location surrounding the first location; and
    forming the solder on the under-bump metallurgy at the second location,
    wherein the solder and the under-bump metallurgy at the second location provide a hermetic seal around the solder and the under-bump metallurgy at the first location.

12. A method, comprising:
    forming a device on a front side of a substrate;
    forming an insulator layer at the front side of the substrate and covering the device;
    forming a through-silicon-via (TSV) extending entirely through the substrate and the insulator layer;
    forming a radio frequency (RF) filter on a backside of the substrate opposite the front side of the substrate; and
    forming an encapsulating seal around the RF filter at the backside of the substrate,
    wherein the TSV electrically couples the RF filter to the device;
    the RF filter comprises a surface acoustic wave (SAW) filter; and
    the TSV comprises a first TSV connected to a first electrode of the SAW filter, and a second TSV is connected to a second electrode of the SAW filter.

13. A semiconductor structure, comprising:
    a device on a front side of a substrate;
    an insulator layer at the front side of the substrate and covering the device;
    a radio frequency (RF) filter on a backside of the substrate; and
    at least one substrate conductor extending from the front side of the substrate to the backside of the substrate and electrically coupling the RF filter to the device, wherein the at least one substrate conductor extends through the substrate and through the insulator layer,
    wherein the RF filter comprises a surface acoustic wave (SAW) filter; and
    the at least one substrate conductor comprises a first through-silicon-via connected to a first electrode of the SAW filter and a second through-silicon-via connected to a second electrode of the SAW filter.

14. The structure of claim 13, wherein the RF filter is encapsulated at the backside of the substrate.

15. The structure of claim 13, further comprising forming a cavity that is: (i) under the RF filter and (ii) between the RF filter and the substrate.

16. The structure of claim 13, wherein the RF filter is one of: (i) bonded to the backside of the substrate with solder and (ii) integrated at the backside of the substrate.

17. The method of claim 1, wherein the providing the RF filter comprises:
    forming a backside insulator layer on the backside of the substrate; and
    forming the RF filter on the backside insulator layer.

18. The structure of claim 13, further comprising a backside insulator layer on the backside of the substrate, wherein the RF filter is on the backside insulator layer.

* * * * *